United States Patent
Shimizu et al.

(10) Patent No.: US 9,601,581 B2
(45) Date of Patent: *Mar. 21, 2017

(54) SEMICONDUCTOR DEVICE AND METHOD FOR PRODUCING THE SAME

(71) Applicant: Kabushiki Kaisha Toshiba, Minato-ku (JP)

(72) Inventors: Tatsuo Shimizu, Shinagawa (JP); Takashi Shinohe, Yokosuka (JP)

(73) Assignee: Kabushiki Kaisha Toshiba, Minato-ku (JP)

( * ) Notice: Subject to any disclaimer, the term of this patent is extended or adjusted under 35 U.S.C. 154(b) by 70 days.

This patent is subject to a terminal disclaimer.

(21) Appl. No.: 14/641,775

(22) Filed: Mar. 9, 2015

(65) Prior Publication Data

US 2015/0270354 A1   Sep. 24, 2015

(30) Foreign Application Priority Data

Mar. 20, 2014  (JP) .................. 2014-059197

(51) Int. Cl.
*H01L 29/16*       (2006.01)
*H01L 21/265*     (2006.01)
(Continued)

(52) U.S. Cl.
CPC ...... *H01L 29/1608* (2013.01); *H01L 21/0485* (2013.01); *H01L 21/265* (2013.01); *H01L 21/26506* (2013.01); *H01L 21/283* (2013.01); *H01L 21/3003* (2013.01); *H01L 21/324* (2013.01); *H01L 29/45* (2013.01); *H01L 29/66068* (2013.01); *H01L 29/7802* (2013.01); *H01L 29/7806* (2013.01);
(Continued)

(58) Field of Classification Search
CPC . H01L 29/1608; H01L 21/265; H01L 21/283; H01L 29/167; H01L 29/36
See application file for complete search history.

(56) References Cited

U.S. PATENT DOCUMENTS

2012/0056202 A1* 3/2012 Wada et al. ............... 257/77
2012/0181550 A1* 7/2012 Fujibayashi ........ H01L 21/0475
257/77
(Continued)

FOREIGN PATENT DOCUMENTS

DE    10 2011 013 375 A1    9/2012
FR    2 871 936 A1    12/2005
(Continued)

OTHER PUBLICATIONS

U.S. Appl. No. 14/619,631, filed Feb. 11, 2015, Tatsuo Shimizu, et al.
(Continued)

*Primary Examiner* — Fernando L Toledo
*Assistant Examiner* — Neil Prasad
(74) *Attorney, Agent, or Firm* — Oblon, McClelland, Maier & Neustadt, L.L.P.

(57) ABSTRACT

A semiconductor device of an embodiment includes a p-type SiC layer; a SiC region provided on the p-type SiC layer and containing H (hydrogen) or D (deuterium) in an amount of $1 \times 10^{18}$ cm$^{-3}$ or more and $1 \times 10^{22}$ cm$^{-3}$ or less; and a metal layer provided on the SiC region.

18 Claims, 23 Drawing Sheets

(51) Int. Cl.
H01L 21/283 (2006.01)
H01L 21/04 (2006.01)
H01L 21/30 (2006.01)
H01L 21/324 (2006.01)
H01L 29/45 (2006.01)
H01L 29/78 (2006.01)
H01L 29/66 (2006.01)
H01L 29/06 (2006.01)
H01L 29/10 (2006.01)

(52) U.S. Cl.
CPC ...... H01L 29/0619 (2013.01); H01L 29/0696 (2013.01); H01L 29/1095 (2013.01)

(56) References Cited

U.S. PATENT DOCUMENTS

2012/0235165 A1* 9/2012 Harada ............. H01L 21/02378 257/77
2013/0059429 A1 3/2013 Danno et al.
2013/0062622 A1* 3/2013 Tsuchiya .................... 257/77
2013/0082241 A1* 4/2013 Kub .................. H01L 27/148 257/21
2015/0270353 A1 9/2015 Shimizu et al.

FOREIGN PATENT DOCUMENTS

JP 4029466 1/2008
JP 2015-185617 A 10/2015

OTHER PUBLICATIONS

Tatsuya Morine, et al., "Characterization of Mg-Implanted 4H-SiC layers", The 60$^{th}$ Japan Society of Applied Physics Spring Meeting, 28p-G22-11, 2013, p. 15-245 (corresponds to Hideharu Matsuura, et al., "Electrical Properties of Mg-Implanted 4H-SiC", Materials Science Forum, vol. 778-780, 2014, pp. 685-688).
Hideharu Matsuura, et al., "Electrical Properties of Mg-Implanted 4H-SiC", Materials Science Forum, vol. 778-780, 2014, pp. 685-688.
Extended European Search Report issued Sep. 28, 2015 in Patent Application No. 15155813.7.

* cited by examiner

METAL LAYER | P-TYPE SiC LAYER

METAL LAYER | P-TYPE SiC LAYER

Al

Ar ANNEALING

H₂ ANNEALING

φm=5.1eV

Ec=3.60eV
Ef
Ev=6.86eV

METAL LAYER    N-TYPE SiC LAYER

φB'

φm=5.1eV
Ef

METAL LAYER

N-TYPE SiC LAYER

SEMICONDUCTOR DEVICE AND METHOD FOR PRODUCING THE SAME

CROSS-REFERENCE TO RELATED APPLICATION

This application is based upon and claims the benefit of priority from Japanese Patent Application No. 2014-059197, filed on Mar. 20, 2014, the entire contents of which are incorporated herein by reference.

FIELD

Embodiments described herein relate generally to a semiconductor device and a method for producing the same.

BACKGROUND

SiC (silicon carbide) is expected to be a next-generation material for semiconductor devices. SiC has excellent physical properties with the band gap being threefold, the breakdown electric field strength being about tenfold and the thermal conductivity being about threefold as compared to Si (silicon). By taking advantage of these properties, a semiconductor device, which has a high breakdown voltage and a low loss and is capable of being operated at a high temperature, can be provided.

It is desired to provide a low-resistance contact between a p-type impurity region or n-type impurity region and a metal that forms an electrode from the viewpoint of improving the properties of semiconductor devices having a MOS structure, such as a MOSFET (metal oxide semiconductor) and an IGBT (insulated gate bipolar transistor).

DETAILED DESCRIPTION

A semiconductor device of an embodiment includes a p-type SiC layer; a SiC region provided on the p-type SiC layer and containing H (hydrogen) or D (deuterium) in an amount of $1 \times 10^{18}$ cm$^{-3}$ or more and $1 \times 10^{22}$ cm$^{-3}$ or less; and a metal layer provided on the SiC region.

Embodiments of the present disclosure will be described below with reference to the drawings. In the descriptions below, the same members etc. are given the same symbols, and explanations of once described members etc. are appropriately omitted.

In the descriptions below, the notations of n$^+$, n and n$^-$ and p$^+$, p and p$^-$ each denote a relative level of impurity concentration in each conductivity type. That is, n$^+$ means that the conductivity type has a relatively high n-type impurity concentration as compared to n, and n$^-$ means that the conductivity type has a relatively low n-type impurity concentration as compared to n. Further, p$^+$ means that the conductivity type has a relatively high p-type impurity concentration as compared to p, and p$^-$ means that the conductivity type has a relatively low p-type impurity concentration as compared to p. "n$^+$-type" and "n$^-$-type" may each be simply described as "n-type", and "p$^+$-type" and "p$^-$-type" may be simply described as "p-type".

First Embodiment

A semiconductor device of this embodiment includes a p-type SiC layer; a SiC region provided on the p-type SiC layer and containing H (hydrogen) or D (deuterium) in an amount of $1 \times 10^{18}$ cm$^{-3}$ or more and $1 \times 10^{22}$ cm$^{-3}$ or less; and a metal layer provided on the SiC region.

Figure 1:
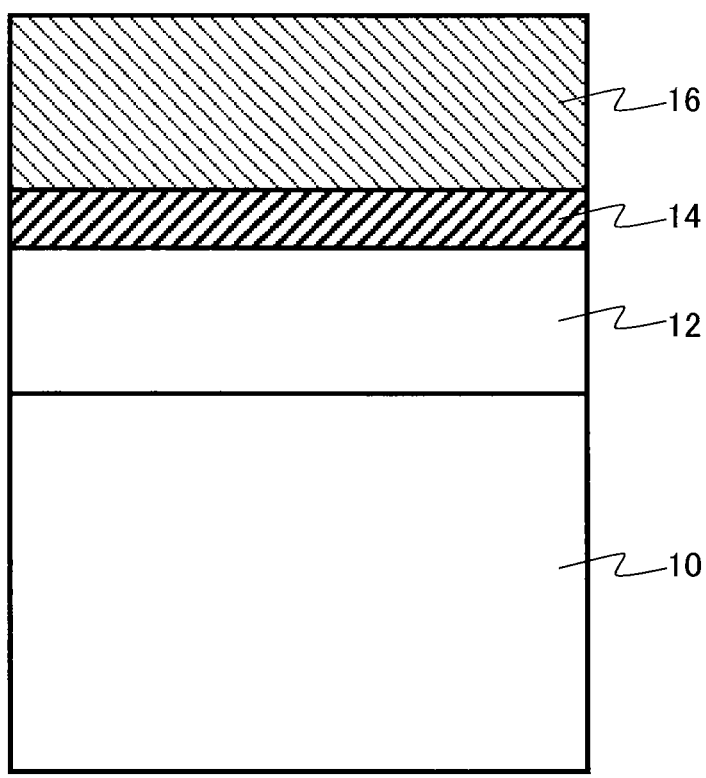
FIG. 1 is a schematic sectional view of a semiconductor device of a first embodiment.

FIG. 1 is a schematic sectional view of the semiconductor device of this embodiment. FIG. 1 shows a contact structure between a p-type SiC semiconductor and a metal. A p-type SiC layer 12 is provided on a n-type SiC substrate 10, a SiC region 14 is provided on the p-type SiC layer 12, and a metal layer 16 is provided on the SiC region 14.

Hereinafter, the embodiment will be described using the n-type SiC substrate 10, but for example, a p-type SiC substrate may be used. The substrate 10 is not an essential constituent element.

For example, the n-type SiC substrate 10 is a SiC substrate of 4H—SiC, which has an impurity concentration of $1\times10^{15}$ cm$^{-3}$ or more and $1\times10^{20}$ cm$^{-3}$ or less and contains, for example, N (nitrogen) as a n-type impurity. For example, the n-type SiC substrate 10 has a main surface having an off angle of 0 degree or more and 8 degrees or less with respect to the plane.

For example, the p-type SiC layer 12 contains a p-type impurity with an impurity concentration of $1\times10^{18}$ cm$^{-3}$ or more and $1\times10^{22}$ cm$^{-3}$ or less. The p-type impurity is, for example, Al (aluminum).

The SiC region 14 contains H (hydrogen) or D (deuterium) (hereinafter, H (hydrogen) or D (deuterium) is also referred to simply as "hydrogen" as a concept including deuterium that is an isotope of hydrogen) in an amount of $1\times10^{18}$ cm$^{-3}$ or more and $1\times10^{22}$ cm$^{-3}$ or less. The content of hydrogen in SiC region can be measured by, for example, SIMS (secondary ion mass spectrometry). The content of hydrogen is, for example, $1\times10^{12}$ cm$^{-2}$ or more and $1\times10^{16}$ cm$^{-2}$ or less in terms of a surface density.

The SiC region 14 is metal. That is, it is metallized SiC. The work function of the SiC region 14 is desirable to be 6.0 eV or more from the viewpoint of ensuring that the contact between the p-type SiC layer 12 and the metal layer 16 is made to be an ohmic contact.

Hydrogen in the SiC region 14 is positioned at the Si (silicon) site of SiC structure. For example, 80% or more of hydrogen in the SiC region 14 is positioned at the Si (silicon) site of SiC structure. Whether or not hydrogen in the SiC region 14 is positioned at the Si (silicon) site of SiC structure can be determined by measurement by, for example, XPS (X-ray photoelectron spectroscopy).

The film thickness of the SiC region 14 is, for example, 1 nm or more and 1 μm or less.

The material that forms the metal layer 16 is not particularly limited. Examples of the material that forms the metal layer 16 include TiN (titanium nitride), W (tungsten), polycrystalline silicon, Al (aluminum), Ti (titanium), Cu (copper), Ni (nickel), Pt (platinum) and Au (gold).

The function and effect of this embodiment will be described below.

As a result of studies from first principle calculation by the inventors, it has become evident that when H (hydrogen) enters the site of Si (silicon) of SiC structure, SiC is metallized. Further, according to first principle calculation, it has become evident that the work function is almost equal to 6.86 eV, a potential energy measured from the vacuum state at the upper end of the valence band of SiC. Specifically, the work function is 6.0 eV or more, for example 6.23 eV.

FIGS. 2A, 2B, 3A and 3B are views for explaining the function of the semiconductor device of this embodiment.

Figure 2A:
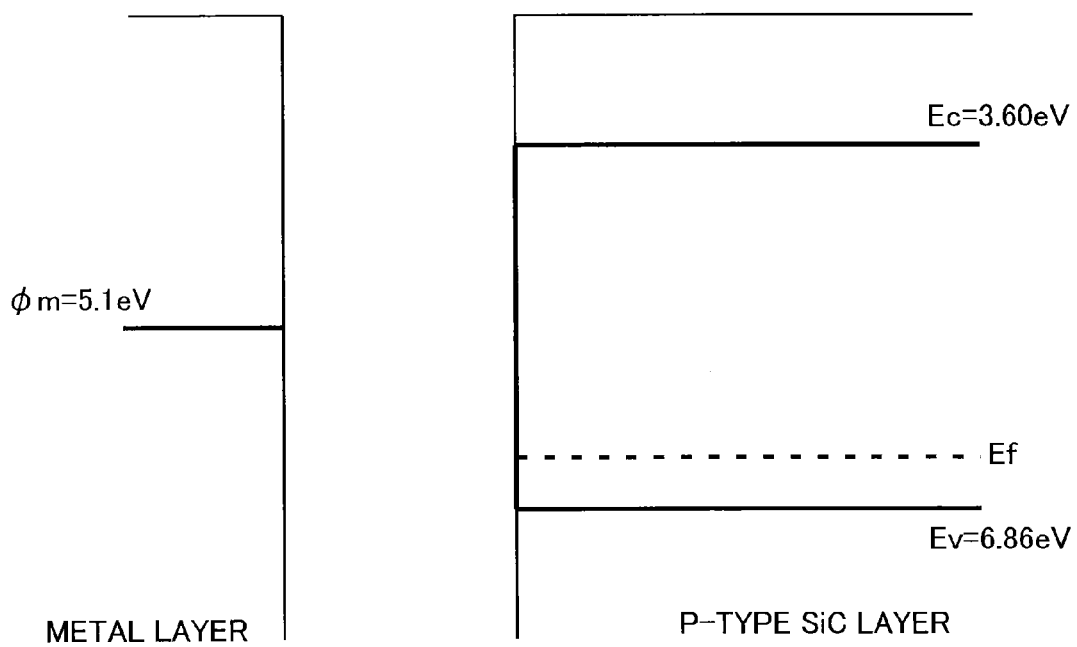
FIGS. 2A and 2B are views for explaining the function of the semiconductor device of the first embodiment.
Figure 2B:
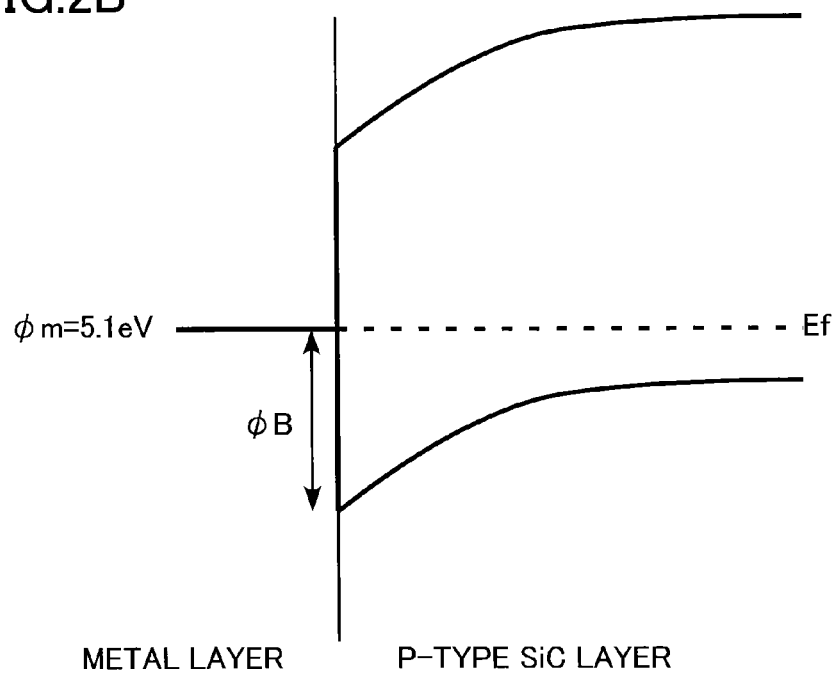
Figure 3A:
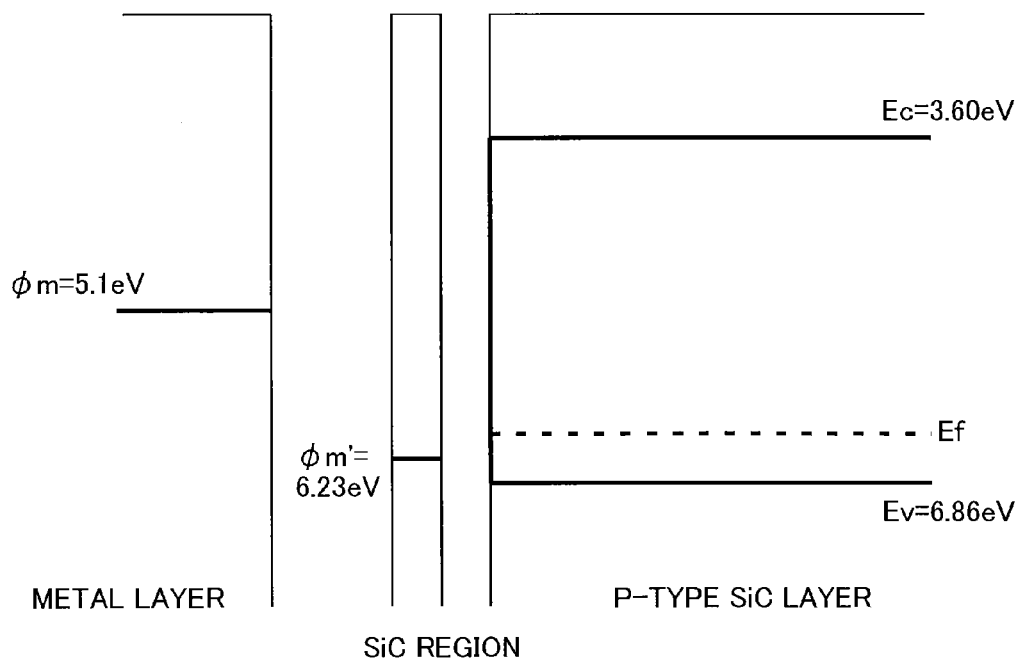
FIGS. 3A and 3B are views for explaining the function of the semiconductor device of the first embodiment.
Figure 3B:
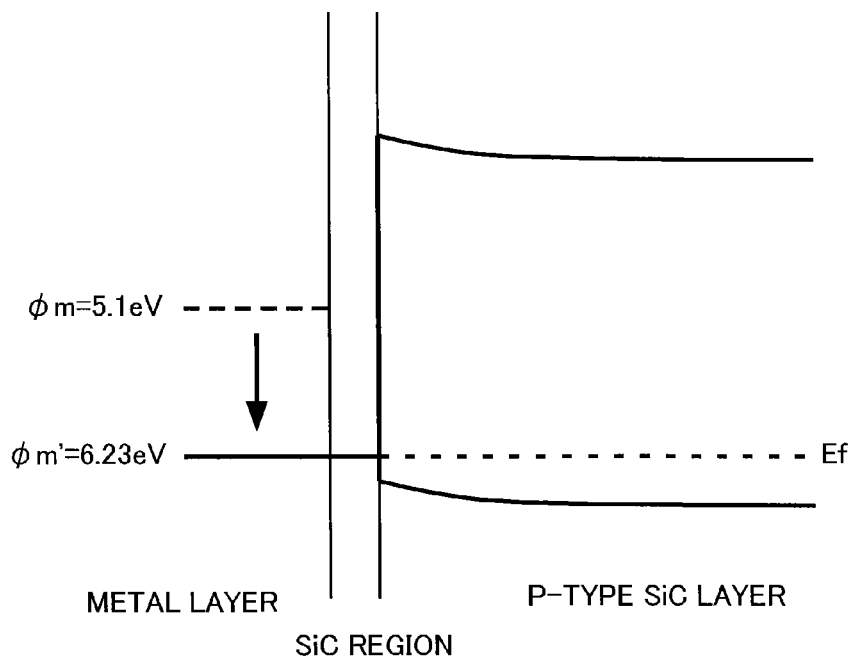

FIGS. 2A and 2B are band diagrams of a contact between the p-type SiC layer 12 and the metal layer 16 when the SiC region 14 is absent. FIGS. 3A and 3B are band diagrams of a contact between the p-type SiC layer 12 and the metal layer 16 when the SiC region 14 is present. FIGS. 2A and 3A are band diagrams before the SiC layer 12 and the metal layer 16 come into contact with each other, and FIGS. 2B and 3B are band diagrams after the SiC layer 12 and the metal layer 16 come into contact with each other.

In all of FIGS. 2A, 2B, 3A and 3B, a metal having a work function ($\phi$m) in the vicinity of a mid gap of SiC is assumed as the metal layer 16. Specifically, the metal is Ni (nickel) having a work function ($\phi$m) of 5.1 eV.

As shown in FIG. 2A, the p-type SiC layer 12 has a potential energy (Ev) of 6.86 eV at the upper end of the valence band and a potential energy (Ec) of 3.60 eV at the lower end of conduction band. In the p-type SiC layer 12, the fermi level (Ef) is at a position close to the upper end of the valence band.

As shown in FIG. 2B, when the p-type SiC layer 12 and the metal layer 16 come into contact with each other, the contact between the p-type SiC layer 12 and the metal layer 16 becomes a Schottky contact in which a Schottky barrier ($\phi$B) exists.

Among metal materials applicable in the semiconductor process, there is no suitable material having a work function close to a work function in the vicinity of a potential energy (Ev) at the upper end of the valence band of SiC. Therefore, it is difficult for the contact between the p-type SiC layer 12 and the metal layer 16 to be an ohmic contact.

As shown in FIG. 3A, the metallic SiC region 14 in this embodiment has a work function ($\phi$m') in the vicinity of a potential energy (Ev) at the upper end of the valence band of SiC. Specifically, the work function is 6.0 eV or more, and for example, $\phi$m' is 6.23 eV.

FIG. 3B shows a case where the p-type SiC layer 12 and the metal layer 16 are in contact with each other with the SiC region 14 interposed therebetween. In this case, there is almost no Schottky barrier between the p-type SiC layer 12 and the SiC region 14. Between the SiC region 14 and the metal layer 16, the SiC region 14 serves as a pinning site, so that the work function of the metal layer 16 increases to apparently 6.23 eV. Therefore, the barrier between the p-type SiC layer 12 and the metal layer 16 becomes extremely small, so that the contact between the p-type SiC layer 12 and the metal layer 16 can be made to be an ohmic contact.

According to the semiconductor device of this embodiment, the SiC region 14 having a work function in the vicinity of the upper end of the valence band in the p-type SiC layer 12 serves as a pinning site to provide an ohmic contact between the p-type SiC layer 12 and the metal layer 16. At this time, the ohmic property no longer depends on a work function of the material that forms the metal layer 16. Therefore, in formation of a contact structure between the p-type SiC layer 12 and the metal layer 16, an optimum material can be selected not in consideration of a contact property but from the viewpoint of other device properties or a production process.

As described above, the SiC region 14 contains hydrogen in an amount of $1\times10^{18}$ cm$^{-3}$ or more and $1\times10^{22}$ cm$^{-3}$ or less in terms of a volume density. The content of hydrogen in the SiC region 14 is desirable to be $1\times10^{19}$ cm$^{-3}$ or more and $1\times10^{21}$ cm$^{-3}$ or less. The content of hydrogen is desirable to be, for example, $1\times10^{13}$ cm$^{-2}$ or more and $1\times10^{15}$ cm$^{-2}$ or less in terms of a surface density. When the content of hydrogen falls below the above-mentioned range, metallization may be insufficient. When the content of hydrogen falls above the above-mentioned range, strain of crystals may increase.

The film thickness of the SiC region 14 is desirable to be, for example, 1 nm or more and 1 μm or less, and desirable to be 2 nm or more and 500 nm or less. When the film thickness of the SiC region 14 falls below the above-mentioned range, the pinning effect may be insufficient. When the film thickness of the SiC region 14 falls above the above-mentioned range, it may be difficult to secure stability in terms of a production process.

A first method for producing a semiconductor device according to this embodiment will now be described. FIGS. 4A to 4E are schematic sectional views of the semiconductor device in the process of production in the first method for producing a semiconductor device according to this embodiment.

The first method for producing a semiconductor device according to this embodiment includes ion-implanting H (hydrogen), or D (deuterium) and C (carbon) into a p-type SiC layer, performing a first heat treatment after the ion implantation of H (hydrogen), or D (deuterium) and C (carbon), and forming a metal layer on the SiC layer after the first heat treatment.

First, the n-type SiC substrate 10 is provided. For example, the n-type SiC substrate 10 is a SiC substrate of 4H—SiC, which has an impurity concentration of $1 \times 10^{15}$ $cm^{-3}$ or more and $1 \times 10^{20}$ $cm^{-3}$ or less and contains, for example, N (nitrogen) as a n-type impurity. For example, the n-type SiC substrate 10 has a main surface having an off angle of 0 degree or more and 8 degrees or less with respect to the plane.

Figure 4A:
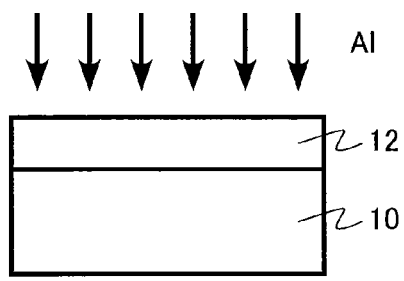
FIGS. 4A to 4E are schematic sectional views of the semiconductor device in the process of production in a first production method in the first embodiment.

Next, a p-type impurity is ion-implanted into the n-type SiC substrate 10 (FIG. 4A). By the ion implantation, the p-type SiC layer 12 is formed. The p-type impurity is, for example, Al (aluminum).

Figure 4B:
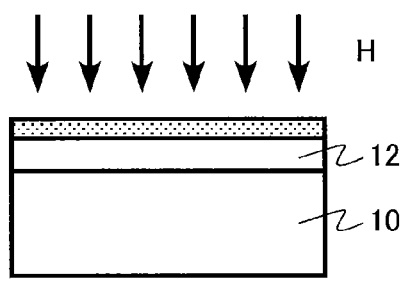

Next, H (hydrogen) or D (deuterium) is ion-implanted into the p-type SiC layer 12 (FIG. 4B). The dose amount of H (hydrogen) or D (deuterium) is, for example, $1 \times 10^{12}$ $cm^{-2}$ or more and $1 \times 10^{16}$ $cm^{-2}$ or less.

Figure 4C:
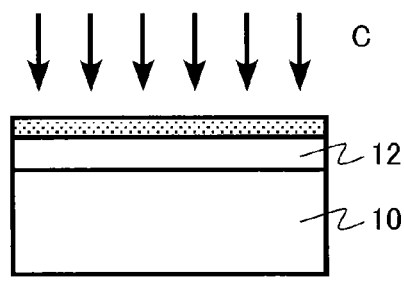

Next, C (carbon) is ion-implanted into the p-type SiC layer 12 (FIG. 4C). The ion implantation is performed for generating defects of Si (silicon) in the SiC layer 12, and causing C (carbon) to exist in an excessive amount, so that H (hydrogen) or D (deuterium) to be introduced into the p-type SiC layer 12 easily enters the site of Si (silicon) of SiC structure.

Figure 4D:
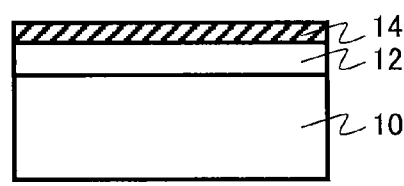

Next, high-temperature annealing (first heat treatment) for activating a p-type impurity is performed (FIG. 4D). For example, high-temperature annealing is performed under conditions of a heating temperature of 1500° C. or higher and 1900° C. or lower and a heating time of 10 minutes or more and 60 minutes of less using a mixed atmosphere of a hydrogen gas and an argon (Ar) gas. For example, the heating temperature is 1600° C. Here, as an inert gas, Ar is used, but a $N_2$ gas, a He gas, a Ne gas or the like may be used. Particularly, the He gas has a small element radius, and therefore has an effect of preventing release of H from a substrate.

The heat treatment method for high-temperature annealing is not particularly limited. Any method such as heater heating, lamp annealing or laser annealing can be applied. Heater heating and lamp annealing are desirable from the viewpoint of reducing process costs.

High-temperature annealing (first heat annealing) is desirable to be performed in an atmosphere containing H (hydrogen), D (deuterium) or He (helium) from the viewpoint of preventing falling of hydrogen from the surface of the p-type SiC layer 12. It is desirable to form, for example, a protective layer of graphite (graphite cap layer) before annealing for preventing evaporation of Si (silicon) into the atmosphere from the surface at the time of high-temperature annealing.

By this heat treatment, the p-type impurity in the p-type SiC layer 12 is activated. H (hydrogen) or D (deuterium) of the p-type SiC layer 12 is activated to enter the site of Si (silicon) of SiC structure, so that the surface of the p-type SiC layer 12 is metallized, leading to formation of the metallic SiC region 14.

Since C (carbon) is introduced in an excessive amount in the p-type SiC layer 12, H (hydrogen) or D (deuterium) in the p-type SiC layer 12 more easily enters the site of Si (silicon) than the site of C (carbon) of SiC structure.

Figure 4E:
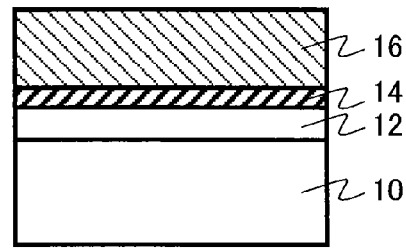

Next, the metal layer 16 is formed on the p-type SiC layer 12 (FIG. 4E).

Thereafter, it is desirable to perform low-temperature annealing (second heat treatment) at a temperature lower than that for the foregoing high-temperature annealing (first heat treatment). For example, low-temperature annealing (second heat treatment) is performed under conditions of a heating temperature of 400° C. or higher and 1000° C. or lower using as an atmospheric gas an inert gas such as an argon (Ar) gas.

The heat treatment method for low-temperature annealing is not particularly limited. Any method such as heater heating, lamp annealing or laser annealing can be applied. Heater heating and lamp annealing are desirable from the viewpoint of reducing process costs.

By the low-temperature annealing (second heat treatment), introduced hydrogen is piled up to the inside of the SiC region 14, particularly to an interface between the p-type SiC layer 12 and the SiC region 14 and an interface between the p-type SiC layer 12 and the metal layer 16. Consequently, metallization of the SiC region 14 further proceeds, so that contact resistance can be reduced.

By the above-mentioned production method, a semiconductor device having a structure shown in FIG. 1 is produced.

In the above-mentioned production method, activation of the p-type impurity and activation of hydrogen are performed in parallel, but can be performed independently of each other.

When activation of the p-type impurity and activation of hydrogen are performed independently of each other, for example, annealing for activating the p-type impurity is performed at 1500° C. or higher and 1900° C. or lower, for example at 1700° C. under, for example, an inert gas atmosphere after ion implantation of the p-type impurity and before ion implantation of hydrogen and carbon.

After ion implantation of hydrogen and carbon and before formation of the metal layer 16, high-temperature annealing (first heat treatment) is performed under conditions of a heating temperature of 400° C. or higher and 1600° C. or lower and a heating time of 10 minutes or more and 60 minutes of less using a mixed atmosphere of a hydrogen gas and an argon (Ar) gas. For example, the heating temperature is 900° C. Here, as an inert gas, Ar is used, but a $N_2$ gas, a He gas, a Ne gas or the like may be used. Particularly, the He gas has a small element radius, and therefore has an effect of preventing release of H from a substrate.

A second method for producing a semiconductor device according to this embodiment will now be described. FIGS. 5A to 5D are schematic sectional views of the semiconductor device in the process of production in the second method for producing a semiconductor device according to this embodiment.

First, the n-type SiC substrate 10 is provided. For example, the n-type SiC substrate 10 is a SiC substrate of 4H—SiC, which has an impurity concentration of $1 \times 10^{15}$ $cm^{-3}$ or more and $1 \times 10^{20}$ $cm^{-3}$ or less and contains, for example, N (nitrogen) as a n-type impurity. For example, the n-type SiC substrate 10 has a main surface having an off angle of 0 degree or more and 8 degrees or less with respect to the plane.

Figure 5A:
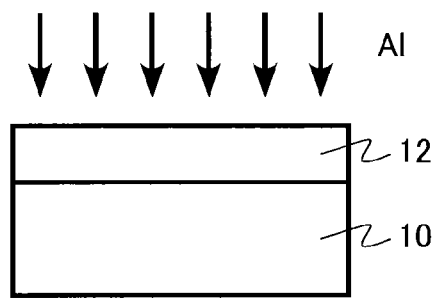
FIGS. 5A to 5D are schematic sectional views of the semiconductor device in the process of production in a second production method in the first embodiment.

Next, a p-type impurity is ion-implanted into the n-type SiC substrate 10 (FIG. 5A). By the ion implantation, the p-type SiC layer 12 is formed. The p-type impurity is, for example, Al (aluminum).

Next, activation annealing of the p-type impurity is performed. Activation annealing of the p-type impurity is performed at a heating temperature of, for example, 1500° C. or higher and 1900° C. or lower, for example 1700° C. using, for example, an argon gas (Ar) gas atmosphere after a graphite cap layer is provided.

Figure 5B:
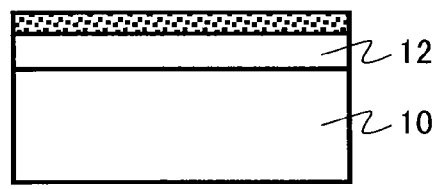

Next, high-temperature annealing (first heat treatment) is performed (FIG. 5B). High-temperature annealing is performed under conditions of a heating temperature of 1000° C. or higher and 1600° C. or lower and a heating time of 10 minutes or more and 60 minutes of less using a mixed atmosphere of a hydrogen gas and an argon (Ar) gas after the graphite cap layer is removed. For example, the heating temperature is 1200° C. Here, as an inert gas, Ar is used, but a $N_2$ gas, a He gas, a Ne gas or the like may be used. Particularly, the He gas has a small element radius, and therefore has an effect of preventing release of H from a substrate.

The heat treatment method for high-temperature annealing is not particularly limited. Any method such as heater heating, lamp annealing or laser annealing can be applied. Heater heating and lamp annealing are desirable from the viewpoint of reducing process costs.

High-temperature annealing (first heat annealing) is desirable to be performed in an atmosphere containing H (hydrogen), D (deuterium) or He (helium) from the viewpoint of preventing falling of hydrogen from the surface of the p-type SiC layer 12.

By the high-temperature annealing, Si (silicon) on the surface of the p-type SiC layer 12 is evaporated to form Si (silicon) defects. The heating temperature is desirable to be 1200° C. or lower from the viewpoint of avoiding excessive etching of the surface of the p-type SiC layer 12.

From the viewpoint of avoiding excessive etching of the surface of the p-type SiC layer 12, for example, high-temperature annealing can be performed in a reaction furnace with a solid Si (silicon) source added to the inner surface of a reaction chamber of a composite member of TaC (tantalum carbide)/Ta (tantalum). The solid Si (silicon) source is evaporated to bring the inside of the furnace into a Si atmosphere, so that excessive etching of the surface of the p-type SiC layer 12 is suppressed. That is, by adjusting the Si atmosphere, the amount of silicon defects formed can be adjusted.

When the high-temperature annealing at such a high temperature (1500° C. or higher and 1900° C. or lower) that the p-type impurity can be activated is performed, the p-type impurity in the p-type SiC layer 12 can be activated at the same time.

Figure 5C:
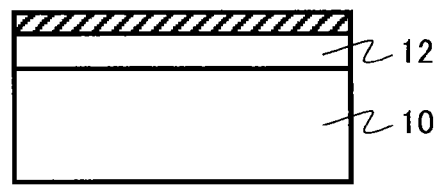

Next, first low-temperature annealing (second heat treatment) is performed at a temperature lower than that for high-temperature annealing (first heat treatment) (FIG. 5C). For example, low-temperature annealing is performed in an atmosphere containing hydrogen like hydrogen annealing, deuterium annealing and the like. Low-temperature annealing may be performed in a mixed atmosphere of a hydrogen gas or deuterium gas and an inert gas such as an argon gas.

For example, first low-temperature annealing is performed at a heating temperature of 400° C. or higher and 1200° C. or lower. For example, the heating temperature is 900° C. By the low-temperature annealing, hydrogen is introduced into Si (silicon) defects formed by high-temperature annealing, i.e. the site of Si (silicon). Consequently, the surface of the p-type SiC layer 12 is metallized to form the metallic SiC region 14.

Figure 5D:
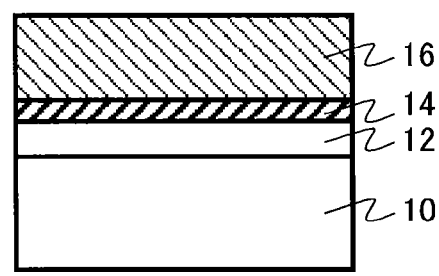

Next, the metal layer 16 is formed on the p-type SiC layer 12 (FIG. 5D).

Thereafter, it is desirable to perform second low-temperature annealing (third heat treatment) at a heating temperature lower than that for the foregoing high-temperature annealing (first heat treatment). For example, second low-temperature annealing (third heat treatment) is performed under conditions of a heating temperature of 400° C. or higher and 1000° C. or lower using as an atmospheric gas an inert gas such as an argon (Ar) gas.

By the second low-temperature annealing (third heat treatment), introduced hydrogen is piled up to the inside of the SiC region 14, particularly to an interface between the p-type SiC layer 12 and the SiC region 14 and an interface between the p-type SiC layer 12 and the metal layer 16. Consequently, metallization of the SiC region 14 further proceeds, so that contact resistance can be reduced.

When the surface of the p-type SiC layer 12 is provided with a region on which the SiC region 14 is not formed, for example, the region should be selectively provided with a protective layer of graphite (graphite cap layer) before high-temperature annealing. It is also possible to form a metallic SiC region having a work function (φm') in the vicinity of a potential energy (Ec) at the lower end of the conduction band of SiC by partially or totally peeling off the graphite cap layer before first low-temperature annealing, and introducing hydrogen into the site of C (carbon) of SiC structure at a portion where the graphite cap layer is peeled off.

It is also possible to perform first low-temperature annealing (second heat treatment) by a hydrogen plasma treatment or deuterium plasma treatment for introducing H (hydrogen) into Si (silicon) defects formed by high-temperature annealing, i.e. the site of Si (silicon). In other words, the atmosphere containing H (hydrogen) or D (deuterium) in first low-temperature annealing (second heat treatment) is plasma H or plasma D. In this case, first low-temperature annealing (second heat treatment) is performed at 0° C. or higher and 1000° C. or lower.

It is also possible to perform evaporation of Si (silicon) and introduction of hydrogen into the Si site in parallel by omitting first low-temperature annealing and performing only high-temperature annealing (first heat treatment) in a hydrogen-containing atmosphere. It is also possible to perform high-temperature annealing and first low-temperature annealing as a continuous heat treatment.

When evaporation of Si (silicon) and introduction of hydrogen into the Si site are performed in parallel, for example, the annealing is performed at a heating temperature of 1000° C. or higher and 1200° C. or lower in an atmosphere containing hydrogen like hydrogen annealing, deuterium annealing and the like. For example, by selectively forming a graphite cap layer, the metallic SiC region 14 can be formed only on a region that is not covered by the graphite cap layer.

By the above-mentioned production method, a semiconductor device having a structure shown in FIG. 1 is produced.

Thus, according to this embodiment, a low-resistance ohmic contact between a p-type SiC layer and a metal layer can be provided by providing a metallic SiC region.

Second Embodiment

A semiconductor device of this embodiment includes a n-type SiC layer; a SiC region provided on the n-type SiC layer, containing H (hydrogen) or D (deuterium) in an amount of $1\times10^{18}$ cm$^{-3}$ or more and $1\times10^{22}$ cm$^{-3}$ or less and having H (hydrogen) or D (deuterium) positioned at the C (carbon) site of SiC structure; and a metal layer provided on the SiC region.

Figure 6:
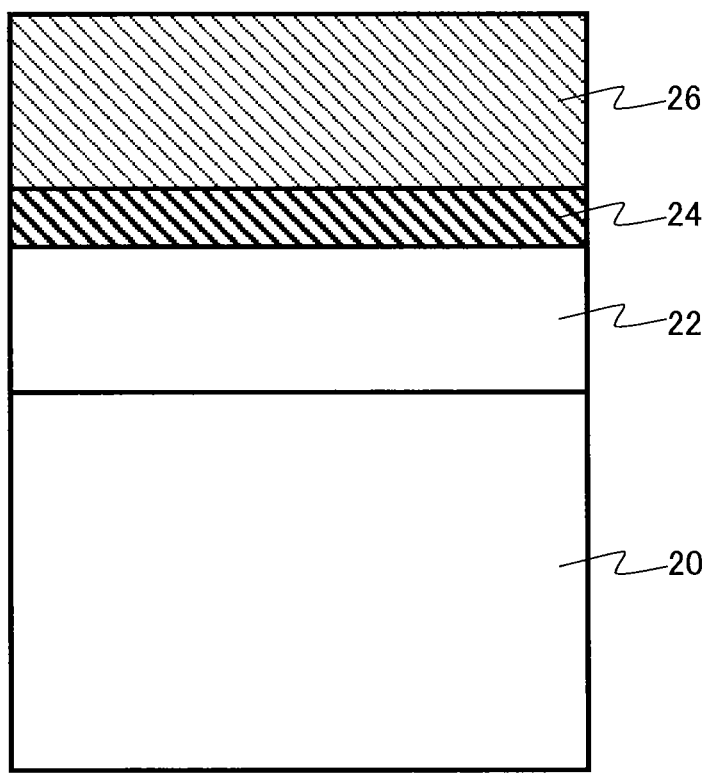
FIG. 6 is a schematic sectional view of a semiconductor device of a second embodiment.

FIG. 6 is a schematic sectional view of the semiconductor device of this embodiment. FIG. 6 shows a contact structure between a n-type SiC semiconductor and a metal. A n-type SiC layer 22 is provided on a p-type SiC substrate 20, a SiC region 24 is provided on the n-type SiC layer 22, and a metal layer 26 is provided on the SiC region 24.

Hereinafter, the embodiment will be described using the p-type SiC substrate 20, but for example, a n-type SiC substrate may be used. The substrate 20 is not an essential constituent element.

For example, the p-type SiC substrate 20 is a SiC substrate of 4H—SiC, which has an impurity concentration of $1\times10^{15}$ cm$^{-3}$ or more and $1\times10^{20}$ cm$^{-3}$ or less and contains, for example, Al (aluminum) as a p-type impurity. For example, the p-type SiC substrate 20 has a main surface having an off angle of 0 degree or more and 8 degrees or less with respect to the plane.

For example, the n-type SiC layer 22 contains a n-type impurity with an impurity concentration of $1\times10^{18}$ cm$^{-3}$ or more and $1\times10^{22}$ cm$^{-3}$ or less. The n-type impurity is, for example, N (nitrogen). The n-type impurity may be P (phosphorus) or As (arsenic).

The SiC region 24 contains H (hydrogen) in an amount of $1\times10^{18}$ cm$^{-3}$ or more and $1\times10^{22}$ cm$^{-3}$ or less. The content of hydrogen in SiC region can be measured by, for example, SIMS (secondary ion mass spectrometry). The content of hydrogen is, for example, $1\times10^{12}$ cm$^{-2}$ or more and $1\times10^{16}$ cm$^{-2}$ or less in terms of a surface density.

The SiC region 24 is metal. That is, it is metallized SiC. The work function of the SiC region 24 is desirable to be 4.0 eV or less from the viewpoint of ensuring that the contact between the n-type SiC layer 22 and the metal layer 26 is made to be an ohmic contact.

Hydrogen in the SiC region 24 is positioned at the C (carbon) site of SiC structure. For example, 80% or more of hydrogen in the SiC region 24 is positioned at the C (carbon) site of SiC structure. Whether or not hydrogen in the SiC region 24 is positioned at the C (carbon) site of SiC structure can be determined by measurement by, for example, XPS (X-ray photoelectron spectroscopy).

The film thickness of the SiC region 24 is, for example, 1 nm or more and 1 μm or less.

The material that forms the metal layer 26 is not particularly limited. Examples of the material that forms the metal layer 26 include TiN (titanium nitride), W (tungsten), polycrystalline silicon, Al (aluminum), Ti (titanium), Cu (copper), Ni (nickel), Pt (platinum) and Au (gold).

The function and effect of this embodiment will be described below.

As a result of studies from first principle calculation by the present inventors, it has become evident that when H (hydrogen) enters the site of C (carbon) of SiC structure, SiC is metallized. Further, according to first principle calculation, it has become evident that the work function is almost equal to 3.60 eV, a potential energy measured from the vacuum state at the lower end of the conduction band of SiC. Specifically, the work function is 4.0 eV or less, for example 3.89 eV.

FIGS. 7A, 7B, 8A and 8B are views for explaining the function of the semiconductor device of this embodiment.

Figure 7A:
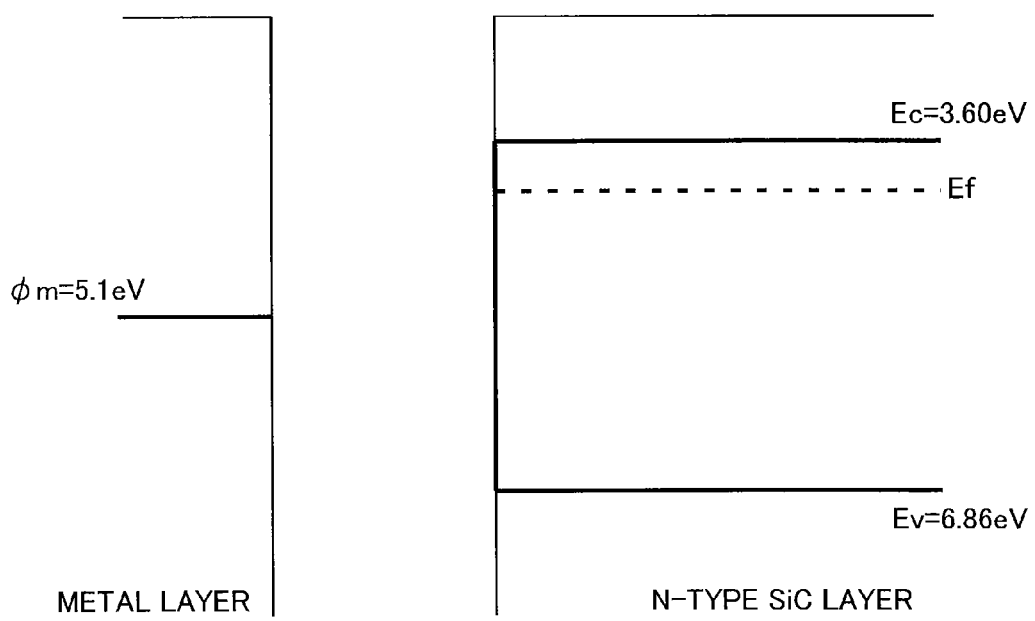
FIGS. 7A and 7B are views for explaining the function of the semiconductor device of the second embodiment.
Figure 7B:
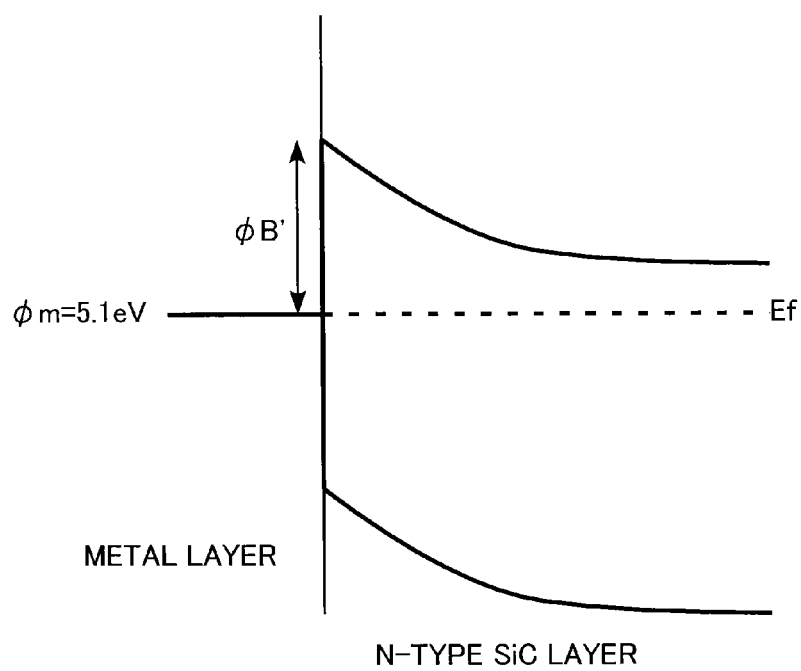
Figure 8A:
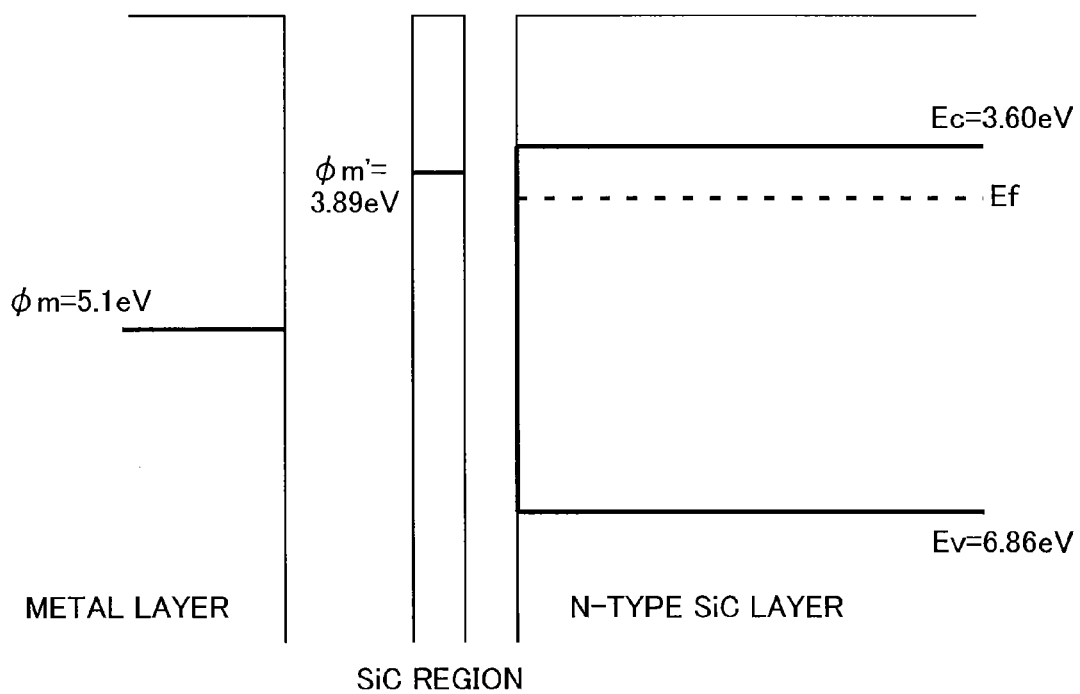
FIGS. 8A and 8B are views for explaining the function of the semiconductor device of the second embodiment.
Figure 8B:
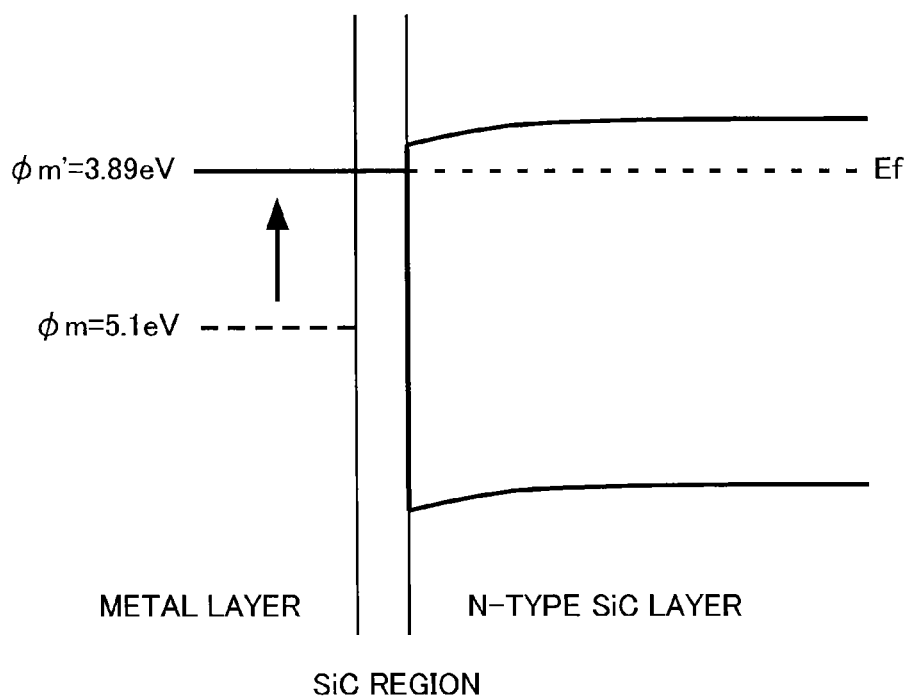

FIGS. 7A and 7B are band diagrams of a contact between the n-type SiC layer 22 and the metal layer 26 when the SiC region 24 is absent. FIGS. 8A and 8B are band diagrams of a contact between the n-type SiC layer 22 and the metal layer 26 when the SiC region 24 is present. FIGS. 7A and 8A are band diagrams before the n-type SiC layer 22 and the metal layer 26 come into contact with each other, and FIGS. 7B and 8B are band diagrams after the n-type SiC layer 22 and the metal layer 26 come into contact with each other.

In all of FIGS. 7A, 7B, 8A and 8B, a metal having a work function (φm) in the vicinity of a mid gap of SiC is assumed as the metal layer 26. Specifically, the metal is Ni (nickel) having a work function (φm) of 5.1 eV.

As shown in FIG. 7A, the n-type SiC layer 22 has a potential energy (Ev) of 6.86 eV at the upper end of the valence band and a potential energy (Ec) of 3.60 eV at the lower end of conduction band. In the n-type SiC layer 22, the fermi level (Ef) is at a position close to the lower end of the conduction band.

As shown in FIG. 7B, when the n-type SiC layer 22 and the metal layer 26 come into contact with each other, the contact between the n-type SiC layer 22 and the metal layer 26 becomes a Schottky contact in which a Schottky barrier (φB) exists.

Among metal materials applicable in the semiconductor process, there is no suitable material having a work function close to a work function in the vicinity of a potential energy (Ev) at the lower end of the conduction band of SiC. Therefore, it is difficult for the contact between the n-type SiC layer 22 and the metal layer 26 to be an ohmic contact.

As shown in FIG. 8A, the metallic SiC region 24 in this embodiment has a work function (φm') in the vicinity of a potential energy (Ec) at the lower end of the conduction band of SiC. Specifically, the work function is 4.0 eV or less, and for example, φm' is 3.89 eV.

FIG. 8B shows a case where the n-type SiC layer 22 and the metal layer 26 are in contact with each other with the SiC region 24 interposed therebetween. In this case, there is almost no Schottky barrier between the n-type SiC layer 22 and the SiC region 24. Between the SiC region 24 and the metal layer 26, the SiC region 24 serves as a pinning site, so that the work function of the metal layer 26 decreases to apparently 3.89 eV. Therefore, the barrier between the n-type SiC layer 22 and the metal layer 26 becomes extremely small, so that the contact between the n-type SiC layer 22 and the metal layer 26 can be made to be an ohmic contact.

According to the semiconductor device of this embodiment, the SiC region 24 having a work function in the vicinity of the lower end of the conduction band in the n-type SiC layer 22 serves as a pinning site to provide an ohmic contact between the n-type SiC layer 22 and the metal layer 26. At this time, the ohmic property no longer depends on a work function of the material that forms the metal layer 26. Therefore, in formation of a contact structure between the n-type SiC layer 22 and the metal layer 26, an optimum material can be selected not in consideration of a contact property but from the viewpoint of other device properties or a production process.

As described above, the SiC region 24 contains H (hydrogen) in an amount of $1\times10^{18}$ cm$^{-3}$ or more and $1\times10^{22}$ cm$^{-3}$ or less in terms of a volume density. The content of H (hydrogen) in the SiC region 24 is desirable to be $1\times10^{19}$ cm$^{-3}$ or more and $1\times10^{21}$ cm$^{-3}$ or less. The content of hydrogen is desirable to be, for example, $1\times10^{13}$ cm$^{-2}$ or more and $1\times10^{15}$ cm$^{-2}$ or less in terms of a surface density. When the content of hydrogen falls below the above-mentioned range, metallization may be insufficient. When the content of hydrogen falls above the above-mentioned range, strain of crystals may increase.

The film thickness of the SiC region 24 is desirable to be, for example, 1 nm or more and 1 μm or less, and desirable to be 2 nm or more and 500 nm or less. When the film thickness of the SiC region 14 falls below the above-mentioned range, the pinning effect may be insufficient. When the film thickness of the SiC region 14 falls above the above-mentioned range, it may be difficult to secure stability in terms of a production process.

A method for producing a semiconductor device according to this embodiment will now be described. FIGS. 9A to 9E are schematic sectional views of the semiconductor device in the process of production in the method for producing a semiconductor device according to this embodiment.

The method for producing a semiconductor device according to this embodiment includes ion-implanting H (hydrogen), or D (deuterium) and Si (silicon) into a n-type SiC layer, performing a first heat treatment after the ion implantation of H (hydrogen), or D (deuterium) and Si (silicon), and forming a metal layer on the SiC layer after the first heat treatment.

First, the p-type SiC substrate 20 is provided. For example, the p-type SiC substrate 20 is a SiC substrate of 4H—SiC, which has an impurity concentration of $1\times10^{15}$ cm$^{-3}$ or more and $1\times10^{20}$ cm$^{-3}$ or less and contains, for example, Al (aluminum) as a p-type impurity. For example, the p-type SiC substrate 20 has a main surface having an off angle of 0 degree or more and 8 degrees or less with respect to the plane.

Figure 9A:
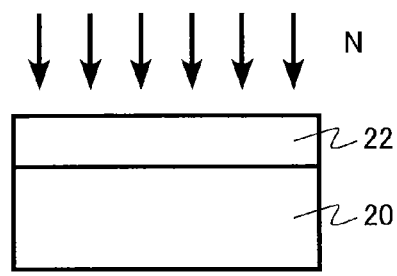
FIGS. 9A to 9E are schematic sectional views of the semiconductor device in the process of production in a production method in the second embodiment.

Next, a n-type impurity is ion-implanted into the p-type SiC substrate 20 (FIG. 9A). By the ion implantation, the n-type SiC layer 22 is formed. The n-type impurity is, for example, N (nitrogen).

Figure 9B:
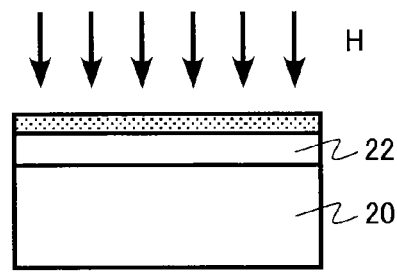

Next, H (hydrogen) or D (deuterium) is ion-implanted into the n-type SiC layer 22 (FIG. 9B). The dose amount of H (hydrogen) or D (deuterium) is, for example, $1\times10^{12}$ cm$^{-2}$ or more and $1\times10^{16}$ cm$^{-2}$ or less.

Figure 9C:
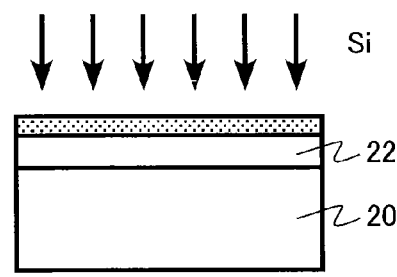

Next, Si (silicon) is ion-implanted into the n-type SiC layer 22 (FIG. 9C). The ion implantation is performed for generating defects of C (carbon) in the n-type SiC layer 22, and causing Si (silicon) to exist in an excessive amount, so that H (hydrogen) to be introduced into the n-type SiC layer 22 easily enters the site of C (carbon) of SiC structure. Of course, in the n-type SiC layer 22, intrinsic C (carbon) defects exist in a certain amount, and therefore ion implantation of Si (silicon) is not necessarily essential in formation of the metallic SiC region 24.

Figure 9D:
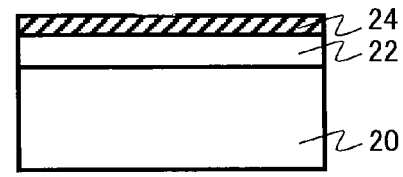

Next, high-temperature annealing (first heat treatment) for activating a n-type impurity is performed (FIG. 9D). For example, high-temperature annealing is performed under conditions of a heating temperature of 1500° C. or higher and 1900° C. or lower and a heating time of 10 minutes or more and 60 minutes of less using a mixed atmosphere of a hydrogen gas and an argon (Ar) gas. For example, the heating temperature is 1600° C. Here, as an inert gas, Ar is used, but a N$_2$ gas, a He gas, a Ne gas or the like may be used. Particularly, the He gas has a small element radius, and therefore has an effect of preventing release of H from a substrate.

The heat treatment method for high-temperature annealing is not particularly limited. Any method such as heater heating, lamp annealing or laser annealing can be applied. Heater heating and lamp annealing are desirable from the viewpoint of reducing process costs.

High-temperature annealing (first heat annealing) is desirable to be performed in an atmosphere containing H (hydrogen), D (deuterium) or He (helium) from the viewpoint of preventing falling of hydrogen from the surface of the n-type SiC layer 22. It is desirable to form, for example, a protective layer of graphite (graphite cap layer) before annealing for preventing evaporation of Si (silicon) into the atmosphere from the surface at the time of high-temperature annealing.

By this heat treatment, the n-type impurity in the n-type SiC layer 22 is activated. H (hydrogen) or D (deuterium) of the n-type SiC layer 22 is activated to enter the site of C (carbon) of SiC structure, so that the surface of the n-type SiC layer 22 is metallized, leading to formation of the metallic SiC region 24.

Since Si (silicon) is introduced in an excessive amount in the n-type SiC layer 22, H (hydrogen) or D (deuterium) in the n-type SiC layer 22 more easily enters the site of C (carbon) than the site of Si (silicon) of SiC structure.

Figure 9E:
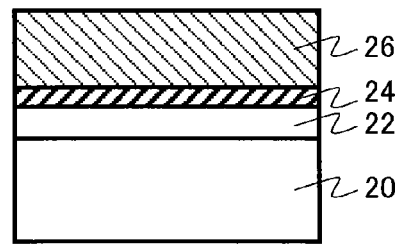

Next, the metal layer 26 is formed on the n-type SiC layer 22 (FIG. 9E).

Thereafter, it is desirable to perform low-temperature annealing (second heat treatment) at a temperature lower than that for the foregoing high-temperature annealing (first heat treatment). For example, low-temperature annealing (second heat treatment) is performed under conditions of a heating temperature of 400° C. or higher and 1000° C. or lower using as an atmospheric gas an inert gas such as an argon (Ar) gas.

The heat treatment method for low-temperature annealing is not particularly limited. Any method such as heater heating, lamp annealing or laser annealing can be applied. Heater heating and lamp annealing are desirable from the viewpoint of reducing process costs.

By the low-temperature annealing (second heat treatment), introduced hydrogen is piled up to the inside of the SiC region 24, particularly to an interface between the n-type SiC layer 22 and the SiC region 24 and an interface between the metal layer 26 and the SiC region 24. Consequently, metallization of the SiC region 24 further proceeds, so that contact resistance can be reduced.

By the above-mentioned production method, a semiconductor device having a structure shown in FIG. 6 is produced.

In the above-mentioned production method, activation of the n-type impurity and activation of hydrogen are performed in parallel, but can be performed independently of each other.

When activation of the n-type impurity and activation of hydrogen are performed independently of each other, for example, annealing for activating the n-type impurity is performed at 1500° C. or higher and 1900° C. or lower, for example at 1700° C. under, for example, an inert gas atmosphere after ion implantation of the n-type impurity and before ion implantation of hydrogen.

After ion implantation of hydrogen and before formation of the metal layer 16, high-temperature annealing (first heat treatment) is performed under conditions of a heating temperature of 400° C. or higher and 1600° C. or lower and a heating time of 10 minutes or more and 60 minutes of less using a mixed atmosphere of a hydrogen gas and an argon (Ar) gas. For example, the heating temperature is 900° C. Here, as an inert gas, Ar is used, but a N$_2$ gas, a He gas, a Ne gas or the like may be used. Particularly, the He gas has a small element radius, and therefore has an effect of preventing release of H from a substrate.

Thus, according to this embodiment, a low-resistance ohmic contact between a n-type SiC layer and a metal layer can be provided by a metallic SiC region.

Third Embodiment

A semiconductor device of this embodiment includes a semiconductor substrate; a n-type SiC layer provided on one side of the semiconductor substrate; a p-type first SiC region provided on the n-type SiC layer; a n-type second SiC region provided on the p-type first SiC region; a p-type third SiC region provided on the p-type first SiC region; a fourth SiC region provided on a surface of the n-type second SiC region and containing H (hydrogen) in an amount of $1\times10^{18}$ cm$^{-3}$ or more and $1\times10^{22}$ cm$^{-3}$ or less; a fifth SiC region provided on a surface of the p-type third SiC region and containing H (hydrogen) in an amount of $1\times10^{18}$ cm$^{-3}$ or more and $1\times10^{22}$ cm$^{-3}$ or less; a gate electrode provided with a gate insulating film interposed between the gate electrode and the n-type SiC layer and between the gate electrode and the first SiC region; a first electrode provided on the fourth and fifth SiC regions; a sixth SiC region provided on the semiconductor substrate on a side opposite to the n-type SiC layer and containing H (hydrogen) or D (deuterium) in an amount of $1\times10^{18}$ cm$^{-3}$ or more and $1\times10^{22}$ cm$^{-3}$ or less; and a second electrode provided in contact with the sixth SiC region.

Figure 10:
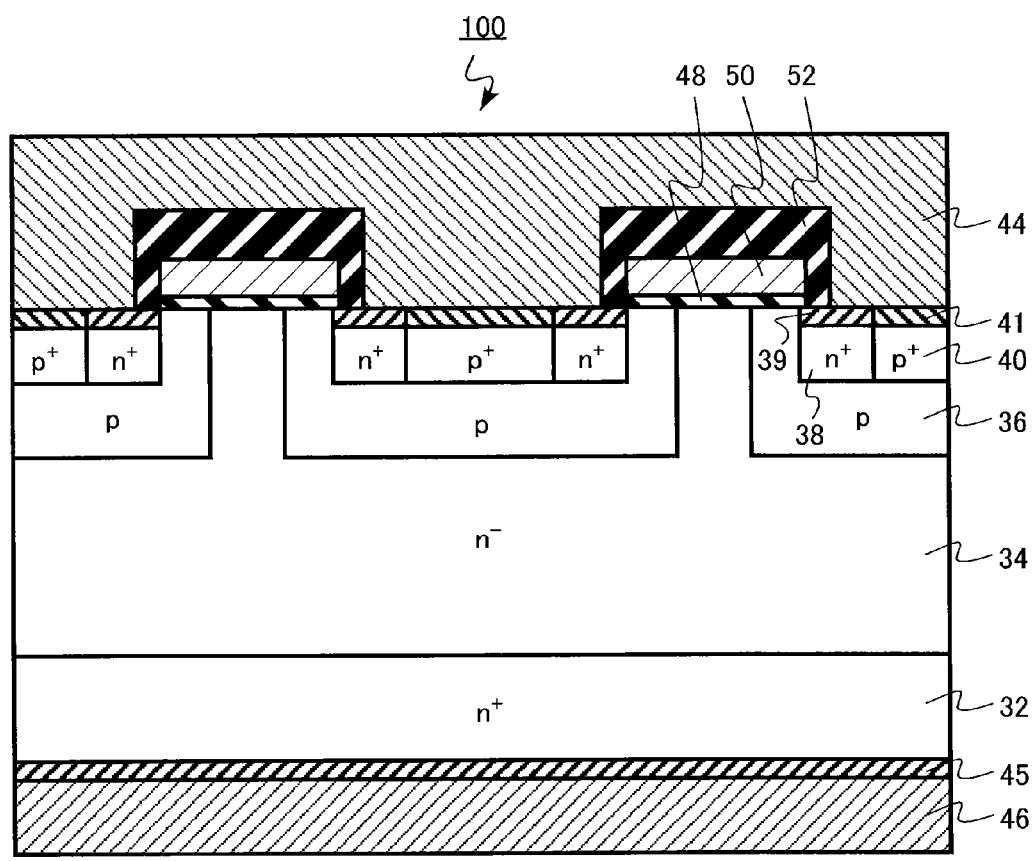
FIG. 10 is a schematic sectional view of a semiconductor device of a third embodiment.

FIG. 10 is a schematic sectional view of the semiconductor device of this embodiment. This MOSFET (metal oxide semiconductor field effect transistor) 100 is, for example, a double implantation MOSFET (DIMOSFET) with a p-well and a source region formed by ion implantation. In FIG. 10, the first surface is a surface on the upper side in the figure, and the second surface is a surface on the lower side in the figure.

In the MOSFET 100 of this embodiment, the contact structure between the p-well contact region and the source electrode includes the contact structure shown in the first embodiment. The contact structure between the source region and the source electrode and between the SiC substrate and the drain electrode includes the contact structure shown in the second embodiment. Accordingly, descriptions of matters that overlap those in the first and second embodiments are omitted.

The MOSFET 100 includes a n$^+$-type semiconductor SiC substrate (semiconductor substrate) 32 having first and second surfaces. For example, the SiC substrate 32 is a SiC substrate of 4H—SiC, which has an impurity concentration of $1\times10^{18}$ cm$^{-3}$ or more and $1\times10^{20}$ cm$^{-3}$ or less and contains, for example, N (nitrogen) as a n-type impurity.

For example, a n$^-$-type SiC layer (drift layer) 34 having a n-type impurity with an impurity concentration of $5\times10^{15}$ cm$^{-3}$ or more and $2\times10^{16}$ cm$^{-3}$ or less is formed on the first surface of the SiC substrate 32. The film thickness of the drift layer 34 is, for example, 5 μm or more and 50 μm or less.

For example, a p-type first SiC region (p-well region) 36 having a p-type impurity with an impurity concentration of $5\times10^{15}$ cm$^{-3}$ or more and $1\times10^{17}$ cm$^{-3}$ or less is formed on the surface of a part of the drift layer 34. The p-type first SiC region (p-well region) 36 is in contact with the drift layer 34.

The depth of the p-well region 36 is, for example, about 0.6 μm or less. The p-well region 36 serves as a channel region of the MOSFET 100.

For example, a n-type second SiC region (source region) 38 having a n-type impurity with an impurity concentration of $1\times10^{18}$ cm$^{-3}$ or more and $1\times10^{22}$ cm$^{-3}$ or less is formed on the surface of a part of the p-well region 36. The source region 38 is in contact with the p-well region 36. The depth of the source region 38 is smaller than the depth of the p-well region 36, and is, for example, about 0.3 μm.

For example, a p$^+$-type third SiC region (p-well contact region) 40 having a p-type impurity with an impurity concentration of $1\times10^{18}$ cm$^{-3}$ or more and $1\times10^{22}$ cm$^{-3}$ or less is formed on the surface of a part of the p-well region 36 and lateral to the source region 38. The p-well contact region 40 is in contact with the p-well region 36. The depth of the p-well contact region 40 is smaller than the depth of the p-well region 36, and is, for example, about 0.3 μm.

A metal source region (fourth SiC region) 39 containing H (hydrogen) or D (deuterium) in an amount of $1\times10^{18}$ cm$^{-3}$ or more and $1\times10^{22}$ cm$^{-3}$ or less is provided on the surface of the n-type source region 38 on the n-type second SiC region (source region) 38. The metal source region 39 is metal. That is, it is metallized SiC. The work function of the metal source region 39 is desirable to be 4.0 eV or less from the viewpoint of ensuring that the contact between the n-type source region 38 and the source electrode 44 is made to be an ohmic contact.

Hydrogen in the metal source region 39 is positioned at the C (carbon) site of SiC structure. For example, 80% or more of hydrogen in the metal source region 39 is positioned at the C (carbon) site of SiC structure. Whether or not hydrogen in the metal source region 39 is positioned at the C (carbon) site of SiC structure can be determined by measurement by, for example, XPS (X-ray photoelectron spectroscopy).

The film thickness of the metal source region 39 is, for example, 1 nm or more and 10 nm or less.

A metal p-well contact region (fifth SiC region) 41 containing H (hydrogen) or D (deuterium) in an amount of $1\times10^{18}$ cm$^{-3}$ or more and $1\times10^{22}$ cm$^{-3}$ or less is provided on the surface of the p$^+$-type p-well contact region 40 on the p$^+$-type third SiC region (p-well contact region) 40.

The metal p-well contact region 41 is metal. That is, it is metallized SiC. The work function of the metal p-well contact region 41 is desirable to be 6.0 eV or more from the viewpoint of ensuring that the contact between the p-well contact region 40 and the source electrode 44 is made to be an ohmic contact.

Hydrogen in the metal p-well contact region 41 is positioned at the Si (silicon) site of SiC structure. For example, 80% or more of hydrogen in the SiC region 14 is positioned at the Si (silicon) site of SiC structure. Whether or not hydrogen in the metal p-well contact region 41 is positioned at the Si (silicon) site of SiC structure can be determined by measurement by, for example, XPS (X-ray photoelectron spectroscopy).

The film thickness of the metal p-well contact region 41 is, for example, 1 nm or more and 10 nm or less.

The surfaces of the drift layer 34 and the p-well region 36 have a gate insulating film 48 continuously formed so as to stride over the layer and the region. The gate insulating film 48 is in contact with the drift layer 34 and the p-well region 36. For the gate insulating film 48, for example, a SiO$_2$ film or a high-k insulating film can be applied.

A gate electrode 50 is provided with the gate insulating film 48 interposed between the gate electrode 50 and the drift layer 34, the p-well region 36 and the source region 38. The gate electrode 50 is formed on the gate insulating film 38. For the gate electrode 50, for example, polysilicon etc. can be applied. An interlayer insulating film 52 formed of, for example, a SiO$_2$ film is formed on the gate electrode 50.

The p-well region 36 at an area sandwiched between the source region 38 and the drift layer 14 under the gate electrode serves as a channel region of the MOSFET 100.

A conductive source electrode (first electrode) 44 that is electrically connected to the metal source region 39 and the metal p-well contact region 41 is provided on the metal source region 39 and the metal p-well contact region 41. The source electrode 44 also serves as a p-well electrode that gives an electrical potential to the p-well region 36.

The source electrode 44 is, for example, TiN (titanium nitride).

A metal drain region (sixth SiC region) 45 containing H (hydrogen) or D (deuterium) in an amount of $1 \times 10^{18}$ cm$^{-3}$ or more and $1 \times 10^{22}$ cm$^{-3}$ or less is provided on the SiC substrate 32 on a side opposite to the drift layer 34, i.e. on the second surface side. The metal drain region 45 is metal. That is, it is metallized SiC. The work function of the metal drain region 45 is desirable to be 4.0 eV or less from the viewpoint of ensuring that the contact between the SiC substrate 32 and the drain electrode 46 is made to be an ohmic contact.

Hydrogen in the metal drain region 45 is positioned at the C (carbon) site of SiC structure. For example, 80% or more of hydrogen in the metal drain region 45 is positioned at the C (carbon) site of SiC structure. Whether or not hydrogen in the metal drain region 45 is positioned at the C (carbon) site of SiC structure can be determined by measurement by, for example, XPS (X-ray photoelectron spectroscopy).

The film thickness of the metal drain region 45 is, for example, 1 nm or more and 10 nm or less.

A conductive drain electrode (second electrode) 46 is formed on the surface of the metal drain region 45. The drain electrode 46 is electrically connected to the SiC substrate 32.

The drain electrode 46 is, for example, TiN (titanium nitride). The film thickness of the drain electrode 46 is, for example, 1 μm or more and 10 μm or less.

In this embodiment, the n-type impurity is, for example, preferably N (nitrogen) or P (phosphorus), but As (arsenic), Sb (antimony) or the like can also be applied. The p-type impurity is, for example, preferably Al (aluminum), but B (boron), Ga (gallium), In (indium) or the like can also be applied.

A method for producing a semiconductor device according to this embodiment will now be described.

Figure 11:
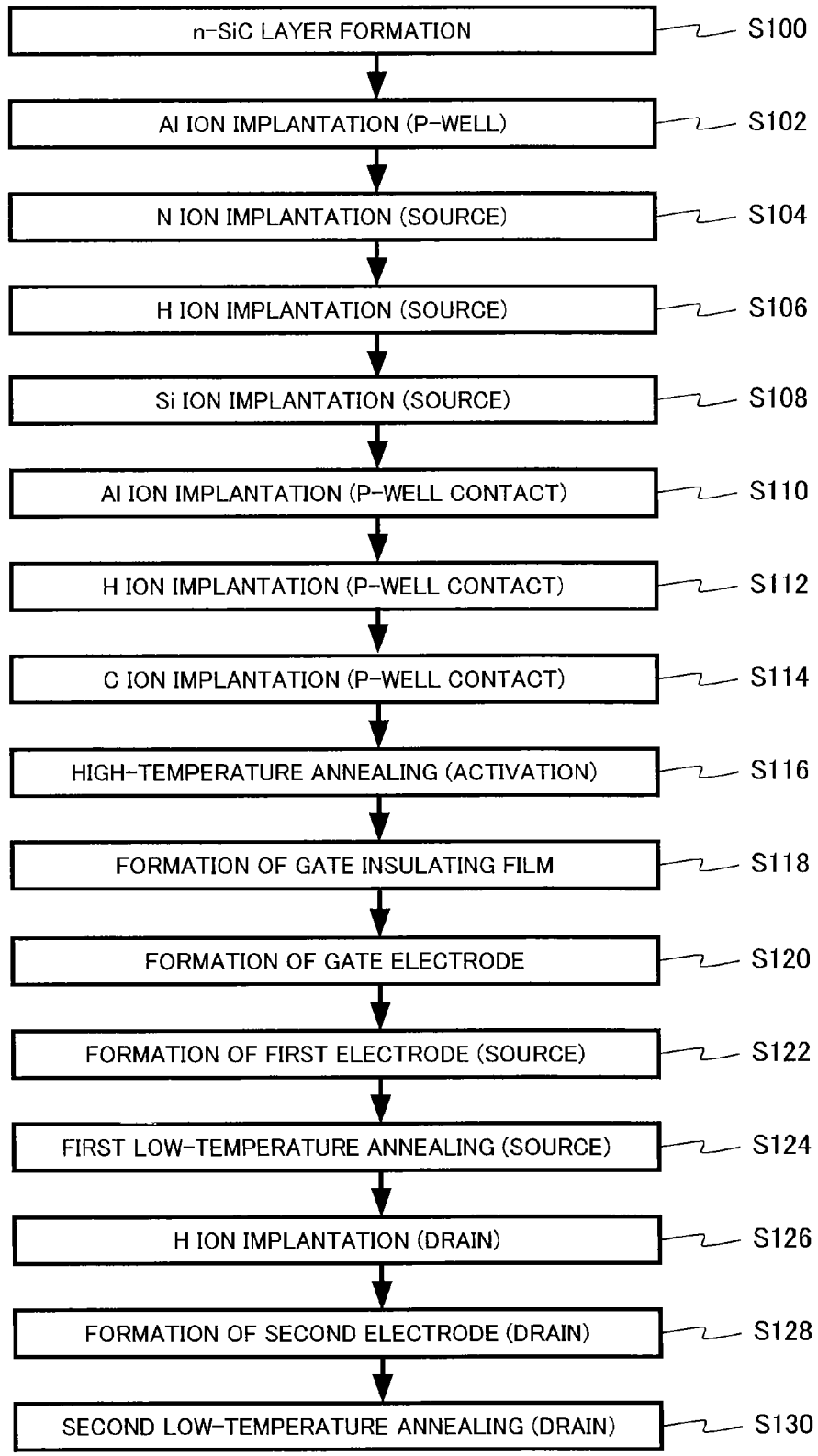
FIG. 11 is a process flow chart illustrating a method for producing a semiconductor device in the third embodiment.

FIG. 11 is a process flow chart illustrating a method for producing a semiconductor device in this embodiment. FIGS. 12 to 19 are schematic sectional views of the semiconductor device in the process of production in the method for producing a semiconductor device according to this embodiment.

As shown in FIG. 11, the method for producing a semiconductor device includes formation of a n⁻ SiC (step S100); Al ion implantation (step S102); N ion implantation (step S104); H ion implantation (step S106); Si ion implantation (step S108); Al ion implantation (step S110); H ion implantation (step S112); C ion implantation (step S114); high-temperature annealing (step S116); formation of a gate insulating film (step 118); formation of a gate electrode (step S120); formation of a first electrode (step S122); first low-temperature annealing (step S124); H ion implantation (S126); formation of a second electrode (step S128); and second low-temperature annealing (step S130).

First, a low-resistance n⁺-type SiC substrate 32 of 4H—SiC, which contains P (phosphorus) or N (nitrogen) as a n-type impurity with an impurity concentration of about $5 \times 10^{18}$ cm$^{-3}$ and has a thickness of, for example, 350 μm, is provided.

In step S100, a high-resistance n⁻ SiC layer (n-type SiC layer) 34 containing, for example, N as a n-type impurity with an impurity concentration of about $1 \times 10^{16}$ cm$^{-3}$ and having a thickness of about 10 μm is epitaxially grown on one surface of the SiC substrate 32 using an epitaxial growth method.

Figure 12:
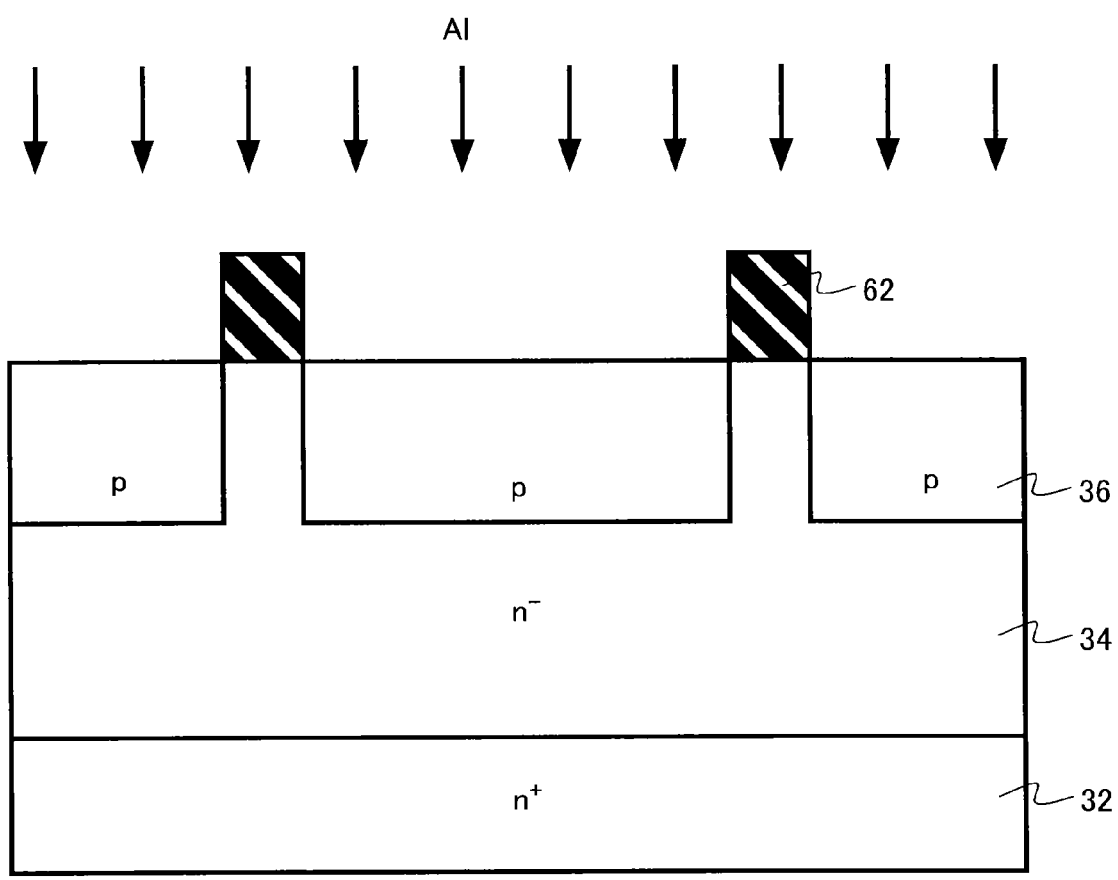
FIG. 12 is a schematic sectional view of the semiconductor device in the process of production in the production method in the third embodiment.

Next, a first mask material 62 of, for example, SiO$_2$ is formed by patterning by photolithography and etching. In step S102, using the first mask material 62 as an ion implantation mask, Al as a p-type impurity is ion-implanted into the SiC layer 34 to form a first SiC region (p-well region) 36 (FIG. 12).

Next, a second mask material 64 of, for example, SiO$_2$ is formed by patterning by photolithography and etching. In step S104, using the second mask material 64 as an ion implantation mask, N as a n-type impurity is ion-implanted into the SiC layer 34 to form an n-type second SiC region (source region) 38 (FIG. 13).

Figure 13:
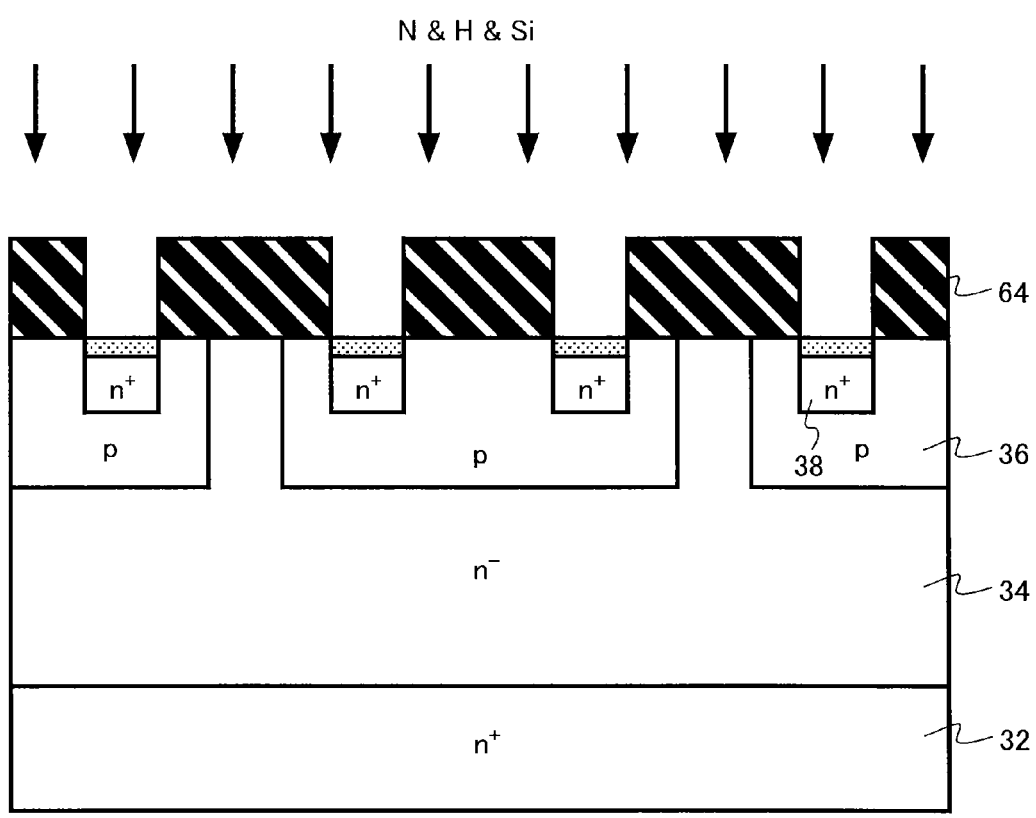
FIG. 13 is a schematic sectional view of the semiconductor device in the process of production in the production method in the third embodiment.

Next, in step S106, using the second mask material 64 as an ion implantation mask, H (hydrogen) is ion-implanted (FIG. 13).

Next, in step S108, using the second mask material 64 as an ion implantation mask, Si is ion-implanted (FIG. 13). By the ion implantation of Si, C (carbon) defects are generated in SiC. This ion implantation is not necessarily essential.

Next, a third mask material 66 of, for example, SiO$_2$ is formed by patterning by photolithography and etching. In step S110, using the third mask material 66 as an ion implantation mask, Al as a p-type impurity is ion-implanted into the SiC layer 34 to form a third SiC region (p-well contact region) 40 (FIG. 14).

Figure 14:
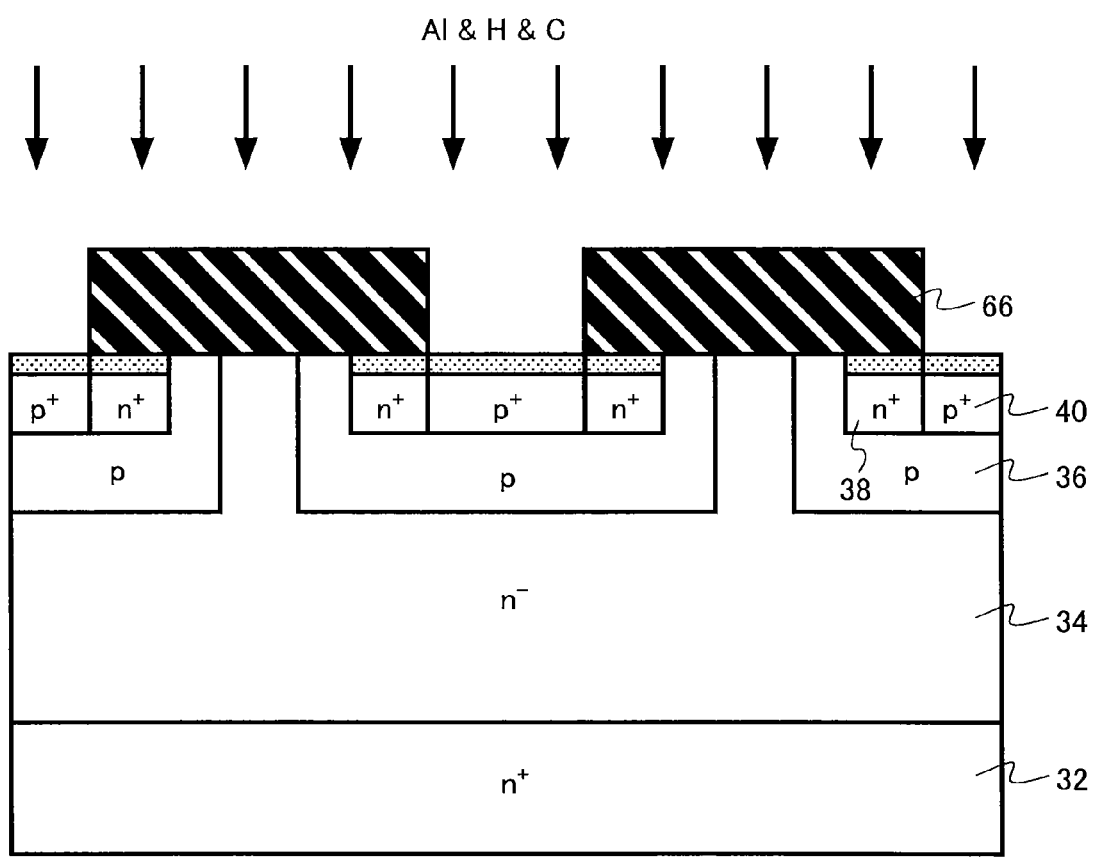
FIG. 14 is a schematic sectional view of the semiconductor device in the process of production in the production method in the third embodiment.

Next, in step S112, using the third mask material 66 as an ion implantation mask, H (hydrogen) is ion-implanted (FIG. 14).

Next, in step S114, using the third mask material 66 as anion implantation mask, C (carbon) is ion-implanted (FIG. 14). By the ion implantation of C (carbon), Si (silicon) defects are generated in SiC, and C (carbon) is generated in an excessive amount.

Figure 15:
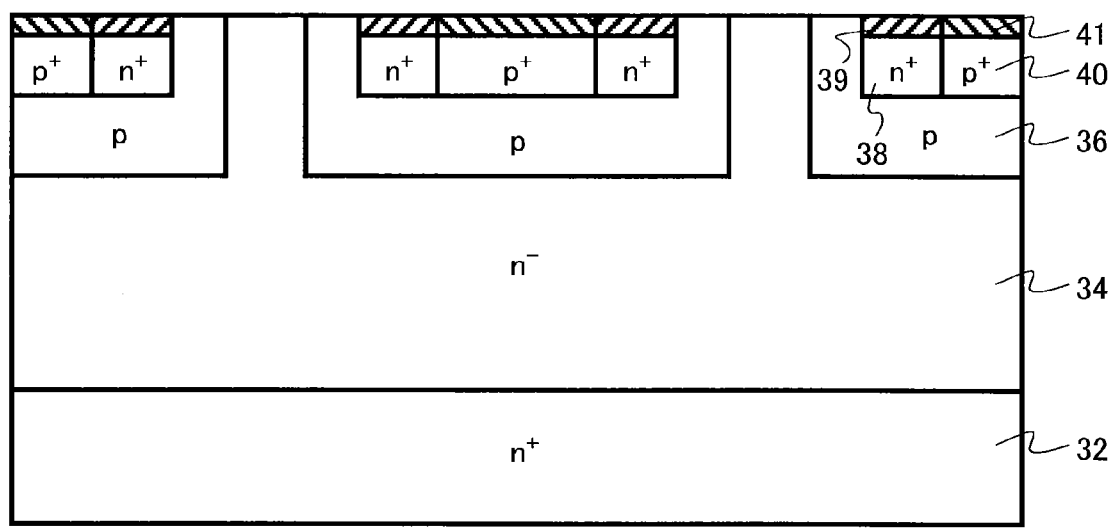
FIG. 15 is a schematic sectional view of the semiconductor device in the process of production in the production method in the third embodiment.

In step S116, high-temperature annealing is performed for activating p-type impurities and n-type impurities in the p-well region 36, the source region 38 and the p-well contact region 40 (FIG. 15). For example, high-temperature annealing is performed under conditions of a heating temperature of 1500° C. or higher and 1900° C. or lower and a heating time of 10 minutes or more and 60 minutes of less using a mixed atmosphere of a hydrogen gas and an argon (Ar) gas.

The heat treatment method for high-temperature annealing is not particularly limited. Any method such as heater heating, lamp annealing or laser annealing can be applied. Heater heating and lamp annealing are desirable from the viewpoint of reducing process costs.

High-temperature annealing (first heat treatment) is desirable to be performed in an atmosphere containing H (hydrogen), D (deuterium) or He (helium) from the viewpoint of preventing falling of H (hydrogen) from the surfaces of the well contact region 40 and the source region 38. It is desirable to form, for example, a protective layer of graphite before annealing for preventing evaporation of Si (silicon) into the atmosphere from the surface at the time of high annealing.

By the high-temperature annealing, the n-type impurity in the source region 38 is activated. H (hydrogen) in the source region 38 enters the site of C (carbon) of SiC structure, so that the surface of the source region 38 is metallized, leading to formation of the metal source region 39.

Since Si (silicon) is introduced in an excessive amount in the source region 38, H (hydrogen) in the source region 38 more easily enters the site of C (carbon) than the site of Si (silicon) of SiC structure.

By the high-temperature annealing, P-type impurities in the p-well region 36 and the p-well contact region 40 are activated. H (hydrogen) or D (deuterium) of the p-well contact region 40 enters the site of Si (silicon) of SiC structure, so that the surface of the p-well contact region 40 is metallized, leading to formation of the metallic p-well contact region 41.

Since C (carbon) is introduced in an excessive amount in the p-well contact region 40, H (hydrogen) or D (deuterium) in the p-well contact region 40 more easily enters the site of Si (silicon) than the site of C (carbon) of SiC structure.

Figure 16:
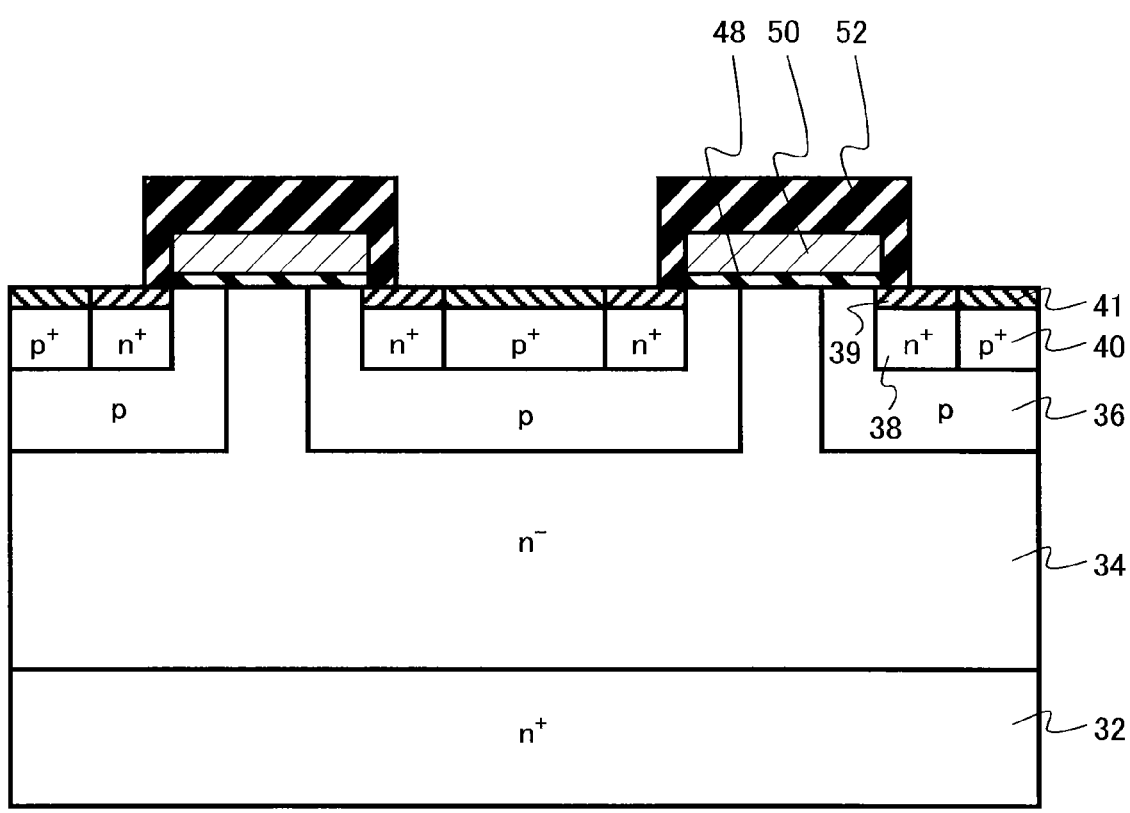
FIG. 16 is a schematic sectional view of the semiconductor device in the process of production in the production method in the third embodiment.

In step S118, a gate insulating film 48 formed of, for example, a SiO$_2$ film is formed by a CVD (chemical vapor deposition) method or a thermal oxidation method. In step S120, a gate electrode 50 of, for example, polysilicon is formed on the gate insulating film 48. An interlayer insulating film 52 formed of, for example, a SiO$_2$ film is formed on the gate electrode 50 (FIG. 16).

Figure 17:
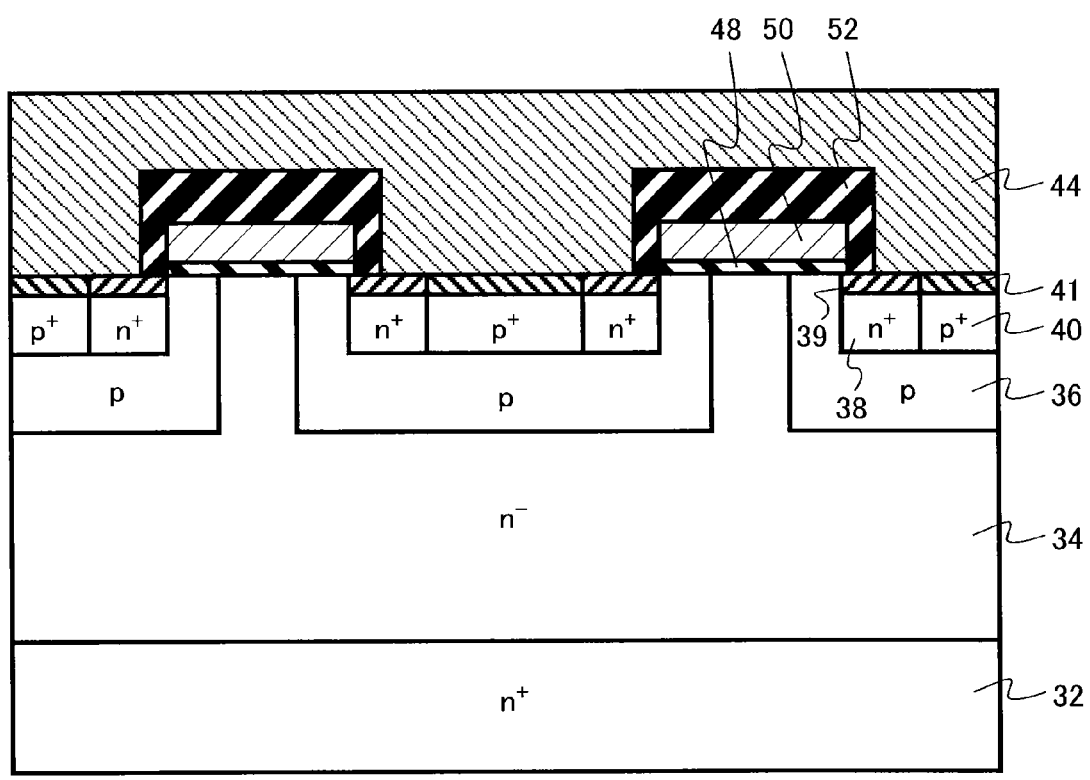
FIG. 17 is a schematic sectional view of the semiconductor device in the process of production in the production method in the third embodiment.

Next, in step S122, a conductive first electrode (source electrode) 44 is formed on the metal source region 39 and the metal p-well contact region 41 (FIG. 17). The source electrode 44 is electrically connected to the metal source region 39 and the metal p-well contact region 41. The source electrode 44 is formed by, for example, sputtering of TiN.

Next, in step S124, first low-temperature annealing (second heat treatment) is performed at a temperature lower than that for the foregoing high-temperature annealing (first heat treatment). For example, first low-temperature annealing (second heat treatment) is performed under conditions of a heating temperature of 400° C. or higher and 1000° C. or lower using as an atmospheric gas an inert gas such as an argon (Ar) gas.

The heat treatment method for first low-temperature annealing is not particularly limited. Any method such as heater heating, lamp annealing or laser annealing can be applied. Heater heating and lamp annealing are desirable from the viewpoint of reducing process costs.

By the first low-temperature annealing (second heat treatment), introduced hydrogen is piled up to the inside of the metal source region 39, particularly to an interface between the source region 38 and the metal source region 39 and an interface between the source electrode 44 and the metal source region 39. Consequently, metallization of the metal source region 39 further proceeds, so that contact resistance can be reduced.

By the first low-temperature annealing (second heat treatment), introduced H (hydrogen) is piled up to the p-well contact region 41, particularly to an interface between the p-well contact region 40 and the metal p-well contact region 41 and an interface between the source electrode 44 and the metal p-well contact region 41. Consequently, metallization of the metal p-well contact region 41 further proceeds, so that contact resistance can be reduced.

Figure 18:
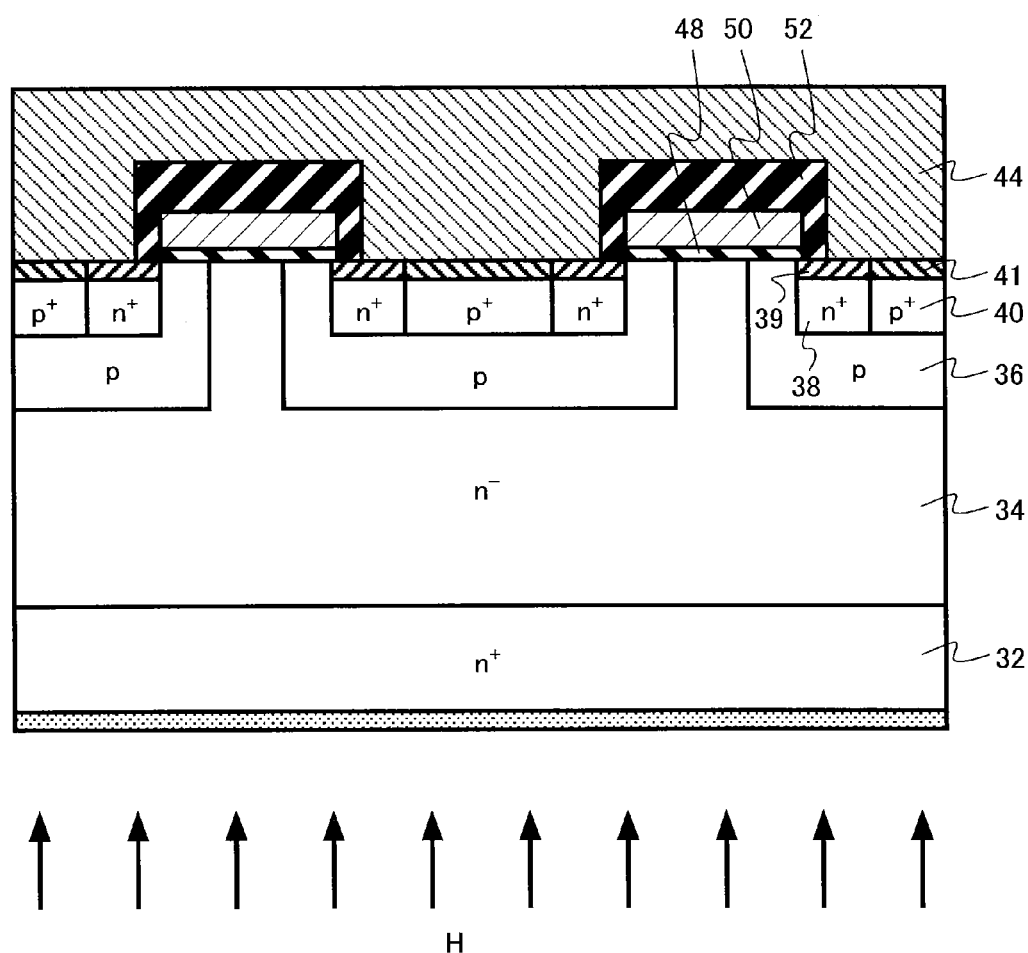
FIG. 18 is a schematic sectional view of the semiconductor device in the process of production in the production method in the third embodiment.

In step S126, H (hydrogen) is ion-implanted into the SiC substrate 32 on a side opposite to the SiC layer 34 (on the second surface side) (FIG. 18). Si (silicon) may be ion-implanted at the same time.

Figure 19:
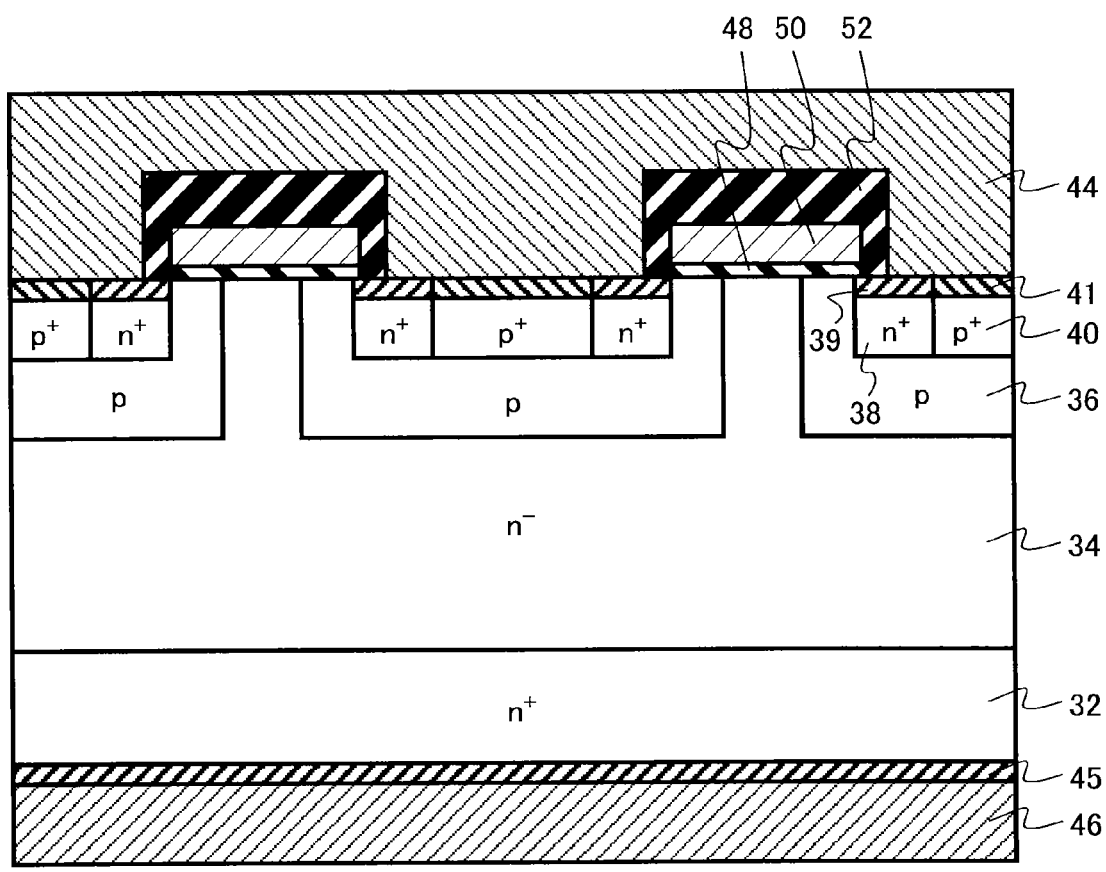
FIG. 19 is a schematic sectional view of the semiconductor device in the process of production in the production method in the third embodiment.

Next, in step S128, a conductive second electrode (drain electrode) 46 is formed on the SiC substrate 32 on a side opposite to the SiC layer 34 (on the second surface side) (FIG. 19). The second electrode (drain electrode) 46 is formed by, for example, sputtering of TiN.

In step S130, second low-temperature annealing (third heat treatment) is performed at a temperature lower than that for the foregoing high-temperature annealing (first heat treatment). For example, second low-temperature annealing (third heat treatment) is performed under conditions of a heating temperature of 400° C. or higher and 1000° C. or lower using as an atmospheric gas an inert gas such as an argon (Ar) gas.

The heat treatment method for second low-temperature annealing is not particularly limited. Any method such as heater heating, lamp annealing or laser annealing can be applied. Heater heating and lamp annealing are desirable from the viewpoint of reducing process costs.

By the second low-temperature annealing (third heat treatment), H (hydrogen) in the SiC substrate 32 enters the site of C (carbon) of SiC structure, and the surface of the SiC substrate 32 is metallized to form a metal drain region (sixth SiC region) 45, so that contact resistance can be reduced.

By the above-mentioned production method, the MOSFET 100 shown in FIG. 11 is formed.

Here, a case has been described where H (hydrogen) is introduced into SiC by ion implantation in formation of the metal p-well contact region 41, but it is also possible to employ, for example, a process in which H (hydrogen) is introduced into SiC by evaporation of Si and annealing an a hydrogen atmosphere as shown in the second production method in the first embodiment. In this case, for example, areas other than the region where the metal p-well contact region 41 is formed should be treated while being covered with a protective layer of graphite.

The function and effect of this embodiment will be described in detail below.

It is difficult to form a low-resistance ohmic contact using the same metal material for both a n-type impurity region and a p-type impurity region, like the n-type source region 38 and the p-type source region 40 in the DIMOSFET, in a SiC device. The reason for this is that for example when a metal material capable of providing a low-resistance contact for one of the n-type impurity region and the p-type impurity region is selected, a Schottky barrier is formed between the region and the other region. For SiC, there is no metal material having a work function in the vicinity of the lower end of the conduction band or the upper end of the valence band of SiC, which is suitable for reducing the Schottky barrier for the n-type impurity region and the p-type impurity region.

Therefore, when a low-resistance contact is to be provided for both the n-type impurity region and the p-type impurity region, the production process becomes complicated. It is difficult to form a sufficiently low-resistance ohmic contact for both the n-type impurity region and the p-type impurity region.

According to this embodiment, a metallic metal source region 39 containing H (hydrogen) is provided between the n-type source region 38 and the source electrode 44. The metal source region 39 has a work function in the vicinity of a potential energy (Ec) at the lower end of the conduction band of SiC. The work function of the metal material of the source electrode 44 is pinned to the metal source region 39. Therefore, the contact between the n-type source region 38 and the source electrode 44 can be made to be a low-resistance ohmic contact.

A metallic metal p-well contact region 41 containing H (hydrogen) is provided between the p-type p-well contact region 40 and the source electrode 44. The metal p-well contact region 41 has a work function in the vicinity of a potential energy (Ev) at the upper end of the valence band of SiC. The work function of the material of the source electrode 44 is pinned to the metal p-well contact region 41. Therefore, the contact between the p-type p-well contact region 40 and the source electrode 44 can be made to be a low-resistance ohmic contact.

As described above, according to this embodiment, the contacts between the n-type source region 38 and p-type p-well contact region 40 and the source electrode 44 can be each made to be a low-resistance ohmic contact using the same material. Therefore, the contacts between the n-type source region 38 and p-type p-well contact region 40 and the source electrode 44 can be easily formed in parallel.

At this time, the ohmic property no longer depends on a work function of the material that forms the source electrode 44. Therefore, in formation of contact structures between the n-type source region 38 and p-type p-well contact region 40 and the source electrode 44, an optimum material can be selected not in consideration of a contact property but from the viewpoint of other device properties or a production process.

Further, in this embodiment, a metal drain region 45 containing H (hydrogen) is provided between the n-type SiC substrate 32 and the drain electrode 46. Therefore, the contact between the n-type SiC substrate 32 and the drain electrode 46 can be made to be a low-resistance ohmic contact.

C (carbon) is introduced into the p-well contact region 40 in formation of the metal p-well contact region 41. Accordingly, carbon defects in the p-well region 36 decrease. Therefore, degradation of a forward voltage ($V_F$) of a body diode in the MOSFET is suppressed.

Fourth Embodiment

A semiconductor device of this embodiment is similar to that of the third embodiment except that a MPS (merged PIN Schottky) diode is included as a reflux diode. Accordingly, descriptions of matters that overlap those in the third embodiment are omitted.

Figure 20:
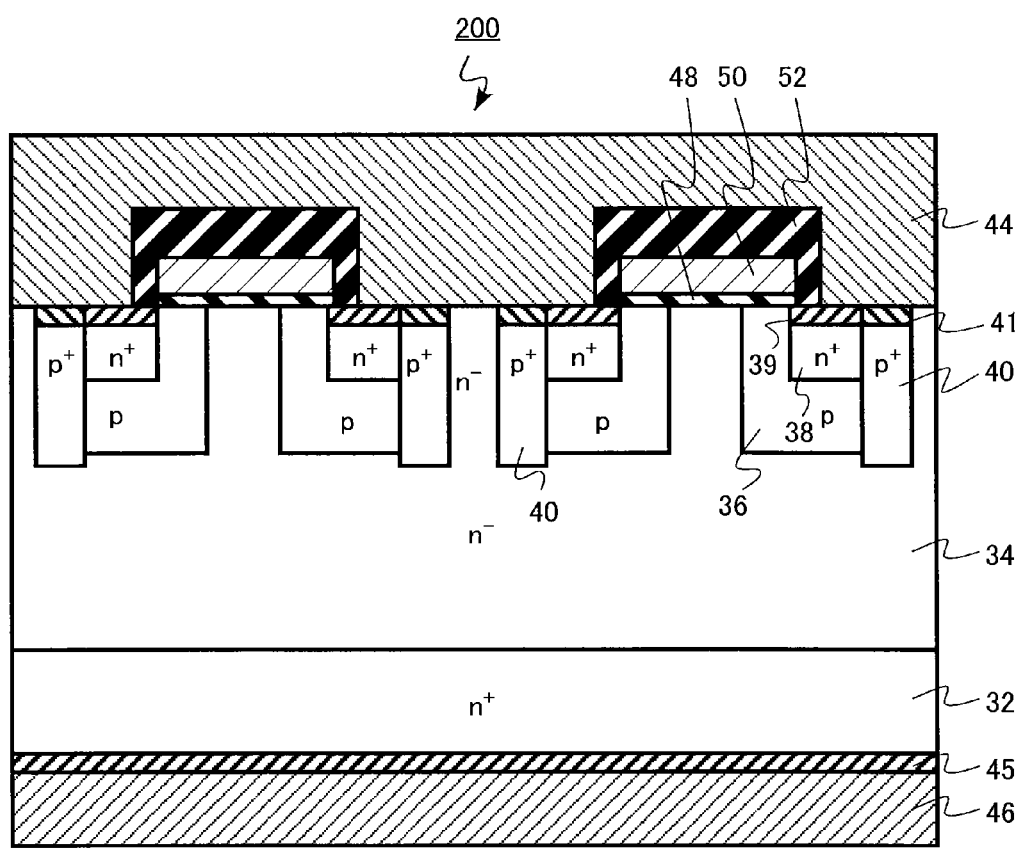
FIG. 20 is a schematic sectional view of a semiconductor device of a fourth embodiment.
Figures 21A, 21B, 21C, 21D:
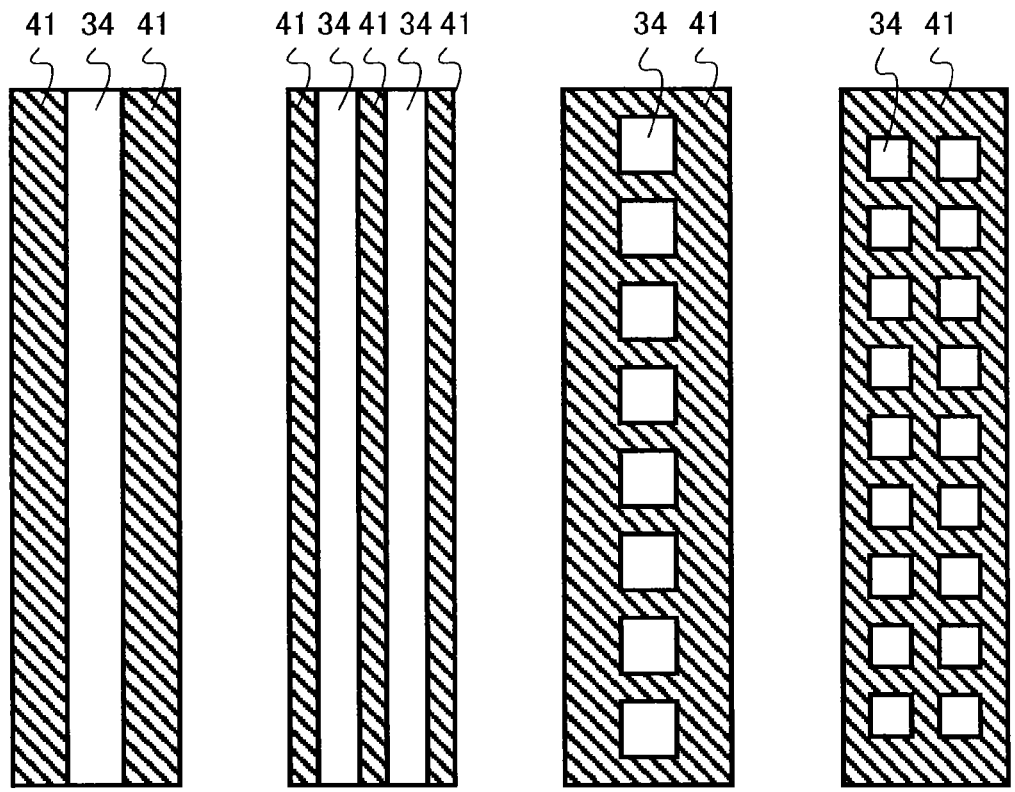
FIGS. 21A to 21E are plan views of a MPS diode unit of the semiconductor device of the fourth embodiment.
Figure 21E:
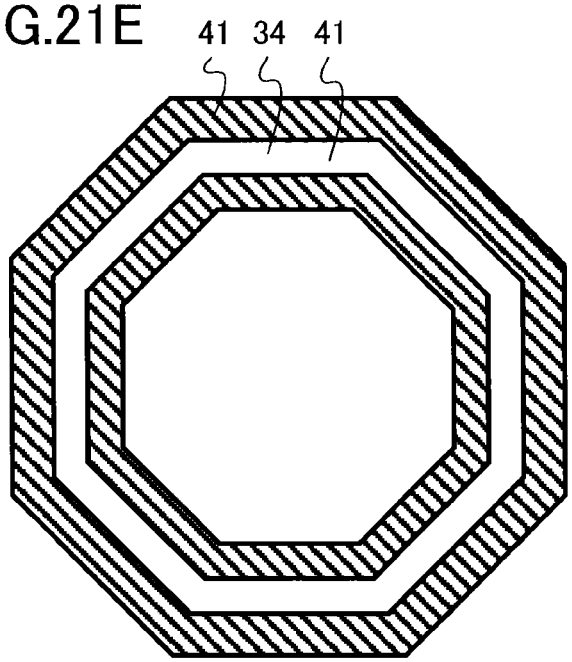

FIG. 20 is a schematic sectional view of the semiconductor device of this embodiment. This MOSFET 200 is a DIMOSFET.

The MOSFET 200 includes, for example, a p-well contact region 40 deeper than the p-well region 36. Further, a region where a n⁻-type SiC layer (drift layer) 34 and a source electrode 44 are in direct contact with each other is provided between two adjacent p-well contact regions 40.

A Schottky contact is established between the source electrode 44 and the n⁻-type SiC layer (drift layer) 34. The source electrode 44, the drift layer 34, the two p-well contact regions 40 and the drain electrode 46 forma MPS diode included in the MOSFET 200. The MPS diode serves as a reflux diode.

FIGS. 21A to 21E are plan views of the MPS diode unit of the semiconductor device of this embodiment. Patterns of the drift layer 34 and the p-well contact region 40 (metal p-well contact region 41) are illustrated. In this embodiment, the same material can be applied for the material of the source electrode 44 that is in contact with the drift layer 34 and the metal p-well contact region 41. Therefore, as shown in FIGS. 21A to 21E, a variety of patterns can be selected in consideration of the properties of the MPS diode etc., the degree of integration of the MPS diode, and so on.

According to this embodiment, selection of a material that forms the source electrode 44 is free from limitations associated with reduction of contact resistance between the metal p-well contact region 41 and the metal source region 39. Therefore, a metal material that forms the source electrode 44 can be selected from the viewpoint of ensuring that the Schottky contact between the source electrode 44 and the drift layer 34 has desired properties. From this viewpoint, the metal material that forms the source electrode 44 is desirable to be Ti (titanium) or Mo (molybdenum).

At the time of reverse biasing of the MPS diode, the width of a depletion layer extending through the drift layer 34 between the two p-well contact regions 40 can be arbitrarily controlled by the depth of the p-well contact region 40 and the distance between the two p-well contact regions 40.

According to the MOSFET 200 of this embodiment, a MPS diode having excellent properties can be included as a reflux diode. Accordingly, in the circuit configuration, it is not necessary to provide a reflux diode as an element different from the MOSFET.

(First Modification)

Figure 22:
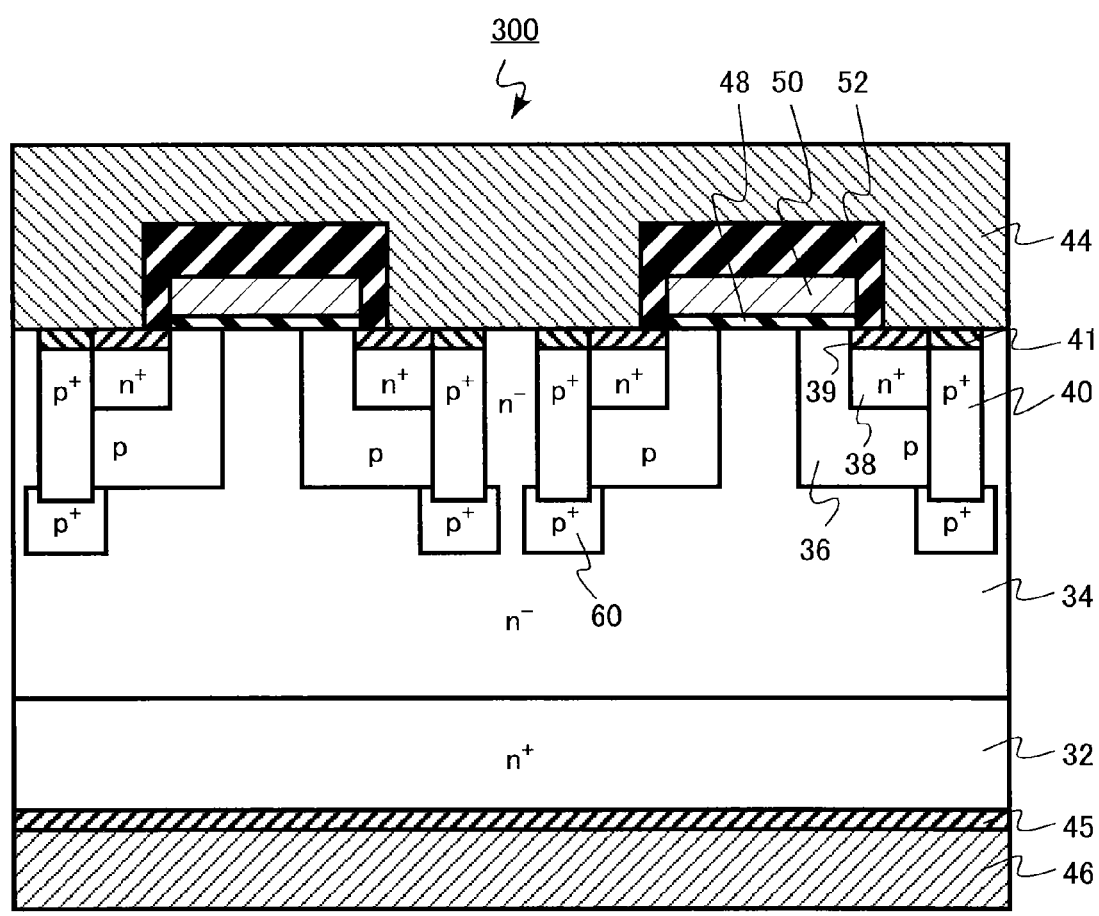
FIG. 22 is a schematic sectional view of a first modification of the semiconductor device of the fourth embodiment.

FIG. 22 is a schematic sectional view of a semiconductor device in the first modification of the fourth embodiment. A MOSFET 300 of this modification is different from the fourth embodiment in that it further includes a p⁺-type semiconductor region 60 on the bottom part of the p-well contact region 40.

The p⁺-type semiconductor region 60 can be formed by, for example, ion implantation of Al (aluminum).

According to the MOSFET 300 of this embodiment, further a MPS diode having an excellent cutoff property at the time of reverse biasing can be included as a reflux diode by appropriately adjusting the width, concentration and so on of the p⁺-type semiconductor region 60.

(Second Modification)

Figure 23:
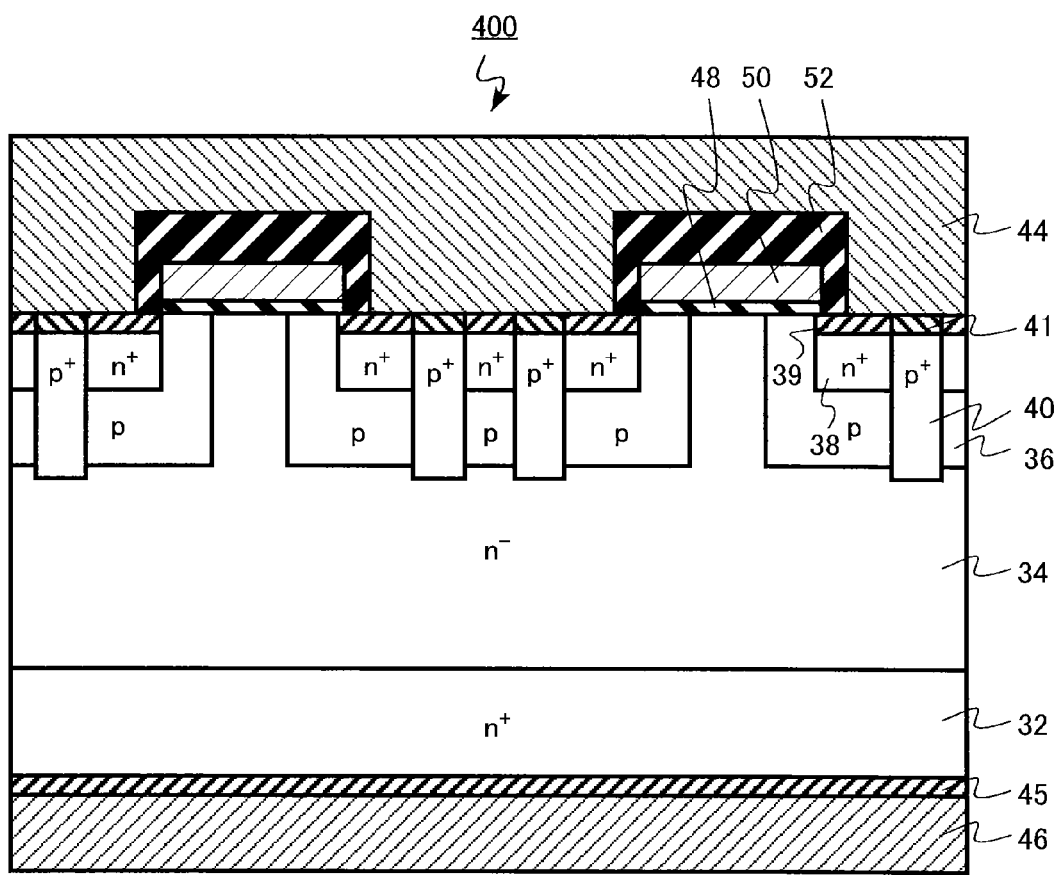
FIG. 23 is a schematic sectional view of a second modification of the semiconductor device of the fourth embodiment.

FIG. 23 is a schematic sectional view of a semiconductor device in the second modification of the fourth embodiment. A MOSFET 400 of this modification is similar to that of the fourth embodiment except that a MPS diode is of so called transparent type.

The MOSFET 400 of this modification has a n-type source region 38 and a metal source region 39 of the surface thereof between two p-well contact regions 40. When the thickness of a resist is controlled, the rising voltage can be controlled by, for example, deliberately reducing the thickness of the p-well region 36 only between metal p-well contacts 41.

According to the MOSFET 400 of this embodiment, further a MPS diode having excellent properties can be included as a reflux diode.

Thus, in the embodiments, the crystal structure of silicon carbide has been described with the case of 4H—SiC as an example, but the present disclosure can be applied to silicon carbide having other crystal structures such as 6H—SiC and 3C—SiC. The main surface of the substrate has been described with the plane as an example, but the present disclosure can also be applied when the substrate has other plane orientations.

In the embodiments, the device structure has been described with a plane-type MOSFET as an example, but the present disclosure can also be applied for other device structures, for example a trench-type MOSFET and a plane-type or trench-type IGBT (insulated gate bipolar transistor).

While certain embodiments have been described, these embodiments have been presented by way of example only, and are not intended to limit the scope of the inventions. Indeed, a semiconductor device and a method for producing the same described herein may be embodied in a variety of other forms; furthermore, various omissions, substitutions and changes in the form of the devices and methods described herein may be made without departing from the spirit of the inventions. The accompanying claims and their equivalents are intended to cover such forms or modifications as would fall within the scope and spirit of the inventions.

What is claimed is:

1. A semiconductor device comprising:
   a p-type SiC layer;
   a first SiC region provided directly on the p-type SiC layer, the first SiC region containing H (hydrogen) or D (deuterium) in an amount of $1\times10^{18}$ cm$^{-3}$ or more and $1\times10^{22}$ cm or less; and
   a metal layer provided directly on the first SiC region.

2. The device according to claim 1, wherein the first SiC region is metal.

3. The device according to claim 1, wherein the H (hydrogen) or D (deuterium) in the first SiC region is positioned at Si (silicon) site of SiC structure.

4. The device according to claim 1, wherein the work function of the first SiC region is 6.0 eV or more.

5. The device according to claim 1, wherein the film thickness of the first SiC region is 1 nm or more.

6. The device according to claim 1, further comprising:
   a n-type SiC layer; and
   a second SiC region provided on the n-type SiC layer, the second SiC region containing H (hydrogen) or D (deuterium) in an amount of $1\times10^{18}$ cm$^{-3}$ or more and $1\times10^{22}$ cm$^{-3}$ or less, the H (hydrogen) or D (deuterium) in the second SiC region being positioned at C (carbon) site of SiC structure,
   wherein
   the metal layer provided on the second SiC region.

7. The device according to claim 6, wherein the second SiC region is meta.

8. The device according to claim 6, wherein the work function of the second SiC region is 4.0 eV or less.

9. The device according to claim 6, wherein the film thickness of the second SiC region is 1 nm or more.

10. A semiconductor device comprising:
    a n-type SiC layer;
    a SiC region provided directly on the n-type SiC layer, the SiC region containing H (hydrogen) or D (deuterium) in an amount of $1\times10^{18}$ cm$^{-3}$ or more and $1\times10^{22}$ cm$^{-3}$ or less, the H (hydrogen) or D (deuterium) being positioned at C (carbon) site of SiC structure; and
    a metal layer provided directly on the SiC region.

11. The device according to claim 10, wherein the SiC region is metal.

12. The device according to claim 10, wherein the work function of the SiC region is 4.0 eV or less.

13. The device according to claim 10, wherein the film thickness of the SiC region is 1 nm or more.

14. A method for producing a semiconductor device, the method comprising
    ion-implanting H (hydrogen), or D (deuterium) and C (carbon) into a p-type SiC layer,
    performing a first heat treatment after the ion implantation of H (hydrogen), or D (deuterium) and C (carbon), and
    forming a metal layer on the SiC layer after the first heat treatment.

15. The method according to claim 14, wherein the first heat treatment is performed in an atmosphere containing H (hydrogen) or D (deuterium).

16. The method according to claim 15, wherein after the metal layer is formed, a second heat treatment is performed at a temperature lower than a temperature of the first heat treatment.

17. The method according to claim 15, wherein the surface of the SiC layer is metallized by the first heat treatment.

18. The method according to claim 15, wherein the dose amount of the H (hydrogen) or D (deuterium) during ion implantation is $1\times10^{12}$ cm$^{-2}$ or more and $1\times10^{16}$ cm$^{-2}$ or less.

* * * * *